United States Patent [19]
Naritake

[11] Patent Number: 6,038,184
[45] Date of Patent: Mar. 14, 2000

[54] SEMICONDUCTOR MEMORY DEVICE HAVING INTERNAL TIMING GENERATOR SHARED BETWEEN DATA READ/WRITE AND BURST ACCESS

[75] Inventor: Isao Naritake, Tokyo, Japan

[73] Assignee: NEC Corporation, Tokyo, Japan

[21] Appl. No.: 09/065,280

[22] Filed: Apr. 23, 1998

[30] Foreign Application Priority Data

Apr. 25, 1997 [JP] Japan ................................. 9-123039

[51] Int. Cl.⁷ ........................................................ G11C 7/00
[52] U.S. Cl. ........................................ 365/221; 365/238.5
[58] Field of Search .................................... 365/221, 233, 365/238.5

[56] References Cited

U.S. PATENT DOCUMENTS

| | | | |
|---|---|---|---|
| 4,947,373 | 8/1990 | Yamaguchi et al. | 365/189.04 |
| 5,381,367 | 1/1995 | Kajimoto | 365/189.01 |

FOREIGN PATENT DOCUMENTS

| | | |
|---|---|---|
| 6-76567 | 3/1994 | Japan . |
| 7-98981 | 4/1995 | Japan . |
| 67-230685 | 8/1995 | Japan . |
| 9-288889 | 11/1997 | Japan . |

OTHER PUBLICATIONS

"The fundmentals of digital data circuits", published May 15, 1986, Technology Reviews Co. Ltd., pp. 146–147, Doctor Tadashi Miyamoto.

*Primary Examiner*—David Nelms
*Assistant Examiner*—M. Tran
*Attorney, Agent, or Firm*—Scully, Scott, Murphy & Presser

[57] ABSTRACT

A semiconductor dynamic random access memory device serially reads out data bits from and serially writes data bits into memory cells through a long burst cycle, and the data bits are transferred between a read/write data bus to data latch circuits, between the data latch circuits and the main/sub sense amplifiers and the main/sub sense amplifiers and the sub-bit line pairs; while the data bits are being stepwise transferred between the memory cells and the read/write data bus, an internal timing controller not only provides activation timings and deactivation timings to the main-sub sense amplifiers and transfer gate arrays but also the starting point and the end point of the long burst cycle so that the semiconductor dynamic random access memory device is fabricated on a relatively small semiconductor chip.

14 Claims, 17 Drawing Sheets

SEMICONDUCTOR MEMORY DEVICE HAVING INTERNAL TIMING GENERATOR SHARED BETWEEN DATA READ/WRITE AND BURST ACCESS

FIELD OF THE INVENTION

This invention relates to a semiconductor memory device and, more particularly, to a semiconductor dynamic random access memory device having a burst data access mode.

DESCRIPTION OF THE RELATED ART

A semiconductor dynamic random access memory device has a burst data transfer mode, and a typical example of the semiconductor dynamic random access memory device is disclosed in Japanese Patent Publication of Unexamined Application No. 7-98981. The semiconductor dynamic random access memory device is a kind of synchronous dynamic random access memory device, the memory cell array of which is arranged in a multiple bank system. The serial data transfer is controlled by a dual internal clock system, and the dual internal clock system minimizes a reset time between burst data transfer operations serially carried out.

FIG. 1 illustrates the dual internal clock system incorporated in the synchronous dynamic random access memory device disclosed in the Japanese Patent Publication of Unexamined Application. The dual internal clock system includes two internal clock sub-systems 1 and 2 arranged in parallel, switching units 3 and 4 connected between a clock node N1 and the input nodes of the internal clock sub-systems 1/2, switching units 5 and 6 respectively connected to the output nodes of the internal clock sub-systems 1/2, a burst controller 7 connected to the switching units 5/6 and a signal generator 8 connected to the burst controller 7. Though not shown in FIG. 1, an array of registers (see FIG. 2) is connected to a memory cell array through a data bus, and read-out data bits are stored in the array of registers.

An external clock signal CLK1 is supplied to the clock node N1, and is transferred to the switching units 3/4. The switching units 3/4 are responsive to switching control signals R1 and R2, and respectively transfer the external clock signal CLK1 to the internal clock sub-systems 1/2. The switching control signals R1 and R2 are complementarily changed between the active level and the inactive level, and, accordingly, the switching units 3/4 complementarily turn on and off. The switching units 5 and 6 are also responsive to the switching control signals R2 and R1, and are complementarily changed between the on-state and the off-state as similar to the switching units 3/4.

A column address strobe signal of active low level CASB is supplied to the internal clock sub-systems 1 and 2, and each of the internal clock sub-systems 1 and 2 is responsive to the external clock signal CLK1 so as to produce a gate control signal CTL1/CTL2 and an internal clock signal CLK2/CLK3. The gate control signal CTL1/CTL2 is supplied to an array of transfer gates (see FIG. 2), and controls a transmission of the read-out data bits from the array of registers to a data buffer (not shown). On the other hand, the internal clock signal CLK2/CLK3 is supplied to the burst controller 7, and the burst controller 7 determines the end point of a burst access. Thus, the burst access is carried out under the control of the burst controlled 7.

When the burst access is completed or a burst interrupter signal BI is supplied to the burst controller 7, the burst controller 7 produces an end signal END, and supplies it to the signal generator 8. The signal generator 8 is responsive to the end signal END so as to complementarily change the switching control signals R1 and R2 between the active level and the inactive level. If the signal generator 8 changes the switching control signal R1 to the active level at an end signal END, the signal generator 8 changes the switching control signal R2 to the active level at the next end signal END.

Assuming now that the synchronous dynamic random access memory device completes a burst access under the control of the burst controller 7 in response to the internal clock signal CLK2, the burst controller 7 supplies the end signal END to the signal generator 8, and the signal generator 8 changes the switching control signal R2 from the active high level to the inactive low level as indicated by "WF2" and the other switching control signal R1 from the inactive low level to the active high level as indicated by "WF1". If the burst interrupt signal B1 is supplied to the burst controller 7 during the burst access in response to the internal clock signal CLK2, the signal generator 8 also changes the switching control signals R1/R2 as indicated by "WF1" and "WF2".

The switching control signal R2 causes the switching units 3 and 5 to turn off, and the internal clock sub-system 1 enters into the reset condition. On the other hand, the switching control signal R1 causes the switching units 4 and 6 to turn on. The other internal clock sub-system 2 has been already reset, and is ready for start. When the column address strobe signal CASB arrives at the internal clock sub-system 2, the internal clock sub-system 2 starts to produce the gate control signal CTL2 and the internal clock signal CLK3 in response to the external clock signal CLK1. The gate control signal CTL2 causes the read-out data bits to be transferred to the output data buffer, and the internal clock signal CLK3 is transferred through the switching unit 6 to the burst controller 7 for the determination of the end point. As a result, the next burst access is carried out under the control of the burst controller 7 in response to the internal clock signal CLK3. Thus, the internal clock sub-systems 1/2 are alternately used for the burst access, and allows the synchronous dynamic random access memory device to repeat the burst access without waiting time for resetting the internal clock system.

The dual internal clock system and the burst controller are detailed in FIG. 2 of the drawings. The switching units 3/4/5/6 are implemented by a parallel combination of p-channel enhancement type field effect transistor and n-channel enhancement type field effect transistor. The parallel combination 9 of p-channel enhancement type field effect transistor and n-channel enhancement type field effect transistor is connected between the clock node N1 and the internal clock sub-system 1/2 or between the internal clock sub-system 1/2 and the burst controller 7, and an inverter 10 produces a complementary signal of the switching control signal R1/R2. The switching control signal R1/R2 and the complementary signal thereof are supplied to the parallel combination 9 so as to concurrently change the n-channel enhancement type field effect transistor and the p-channel enhancement type field effect transistor between the on-state and the off-state.

The internal clock sub-system 1 includes a shift register 11 and an array 12 of transfer gates. The array 13 of registers R1/R2/R3/R4 supplies read-out data bits through an array 14 of transfer gates to an output data buffer (not shown), and the shift register 11 is responsive to the external clock signal CLK1 so as to supply the gate control signal CTL1 through the array of transfer gates 12 to the gate electrodes of the transfer gates of the array 14. The gate control signal CTL1 causes the transfer gates 14 to sequentially turn on, and the transfer gates 14 serially transfer the read-out data bits from the array 13 of registers R1–R4 to the output data buffer.

The other internal clock sub-system 2 behaves as similar to the internal clock sub-system 2. The internal clock sub-system 2 also includes a shift register 15 and an array 16 of transfer gates, and the shift register 15 is responsive to the external clock signal CLK1 so as to supply the gate control signal CTL2 through the array of transfer gates 16 to the gate electrodes of the transfer gates of the array 14. The gate control signal CTL2 causes the transfer gates 14 to sequentially turn on, and the array 14 serially transfers the read-out data bits from the registers R1–R4 to the output data buffer.

The burst controller 7 includes a counter 17 and an OR gate 18. The counter 17 is responsive to the internal clock signals CLK2/CLK3 so as to increment the value stored therein, and produces a preliminary end signal at the final stage of the counter 17. The final stage of the counter 17 is connected to one of the input nodes of the OR gate 18, and the burst interrupt signal BI is supplied to the other of the input nodes of the OR gate 18. When the preliminary end signal or the burst interrupt signal BI is supplied to the OR gate 18, the OR gate produces the end signal END, and supplies it to the signal generator 8.

The signal generator 8 comprises clocked inverters 20, 21, 22 and 23 and inverters 24, 25, 26 and 27. The inverter 24 and the clocked inverter 21 form a first holding loop, and the inverter 25 and the clocked inverter 23 also form a second holding loop. The inverters 26 and 27 respectively produce the switching control signals R1/R2, and the inverter 26, the clocked inverter 20, the first holding loop, the clocked inverter 22 and the second holding loop form a major loop.

The clocked inverters 20 and 21 are responsive to a complementary END signal ENDB of active high level so as to invert the logic level at the input nodes thereof. However, when the complementary end signal ENDB is in the inactive low level, the clocked inverters 20/21 remain in high impedance state. On the other hand, the clocked inverters 22 and 23 are responsive to the end signal END of the active high level for inverting the logic level at the input nodes thereof, and remain in the high impedance state during the inactive low level. If the burst controller 7 changes the end signal END to the active high level at time t1, the inverter 26 produces the switching control signal R1 of the active high level, and the inverter 27 produces the switching control signal R2 of the inactive low level. The complementary end signal ENDB is in the inactive low level, and the clocked inverters 20/21 interrupt the propagation of the high level. When the end signal END is recovered to the inactive low level, the complementary end signal ENDB enables the clocked inverters 20/21. Then, the inverter 24 changes the potential level at the output node to the high level, and the first holding loop maintains the high level at the output node of the inverter 24. If the end signal END is changed to the active high level at time t2, the clocked inverters 22 and 23 are enabled with the end signal END. Then, the inverter 26 changes the switching control signal R1 to the inactive low level, and the inverter 27 changes the switching control signal R2 to the active high level. Thus, the switching control signals R1 and R2 are complementarily changed between the active high level and the inactive low level in response to the end signal END.

As described hereinbefore, the prior art synchronous dynamic random access memory device alternately uses the internal clock sub-systems 1/2, and repeats the burst access without resetting the internal clock sub-system. However, the dual internal clock system requires the counter 17 exclusively used for determination of the end point. In other words, the prior art synchronous dynamic random access memory device requires not only a counter for producing activation timings of word line driver/sense amplifier but also the counter 17 for determining the end point of the burst access. The prior art synchronous dynamic random access disclosed in the Japanese Patent Publication of Unexamined Application delivers only four data bits during a single burst access. However, if the prior art synchronous dynamic random access memory device is expected to serially deliver a large number of data bits such as sixty-four data bits during the burst access, the counter 17 occupies a substantial area on the semiconductor chip, the prior art synchronous dynamic random access memory device requires a large semiconductor chip.

SUMMARY OF THE INVENTION

It is therefore an important object of the present invention to provide a semiconductor memory device, which allows an external device to access data stored therein in a long burst mode without serious increase in the size of the semiconductor chip.

To accomplish the object, the present invention proposes to produce burst control timing signals from output signals of a single counter circuit.

In accordance with one aspect of the present invention, there is provided a semiconductor memory device comprising a plurality of addressable memory cells for storing data bits, an addressing system for selecting accessible memory cells from the plurality of addressable memory cells, a bit line system connected to the plurality of addressable memory cells for supplying first data bits to and from the selected accessible memory cells, a sense amplifier system connected to the bit line system for amplifying the first data bits on the bit line system, a plurality of temporary data storage circuits repeatedly connectable to the sense amplifier system for storing second data bits less than the first data bits at each time, an interface connectable to the plurality of temporary data storage circuits for serially propagating the first data bits between the plurality of temporary data storage circuits and a data port, a controller for sequentially connecting the plurality of temporary data storage circuits to the interface and an internal timing, generator for providing a starting timing of the serial data propagation of the first data bits, an end point of the serial data propagation as well as activation timings and deactivation timings to the addressing system and the sense amplifier system and including a counter counting clock pulses for producing output signals and a decoder producing timing signals from the output signals for providing the activation timings and the deactivation timings.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 1:
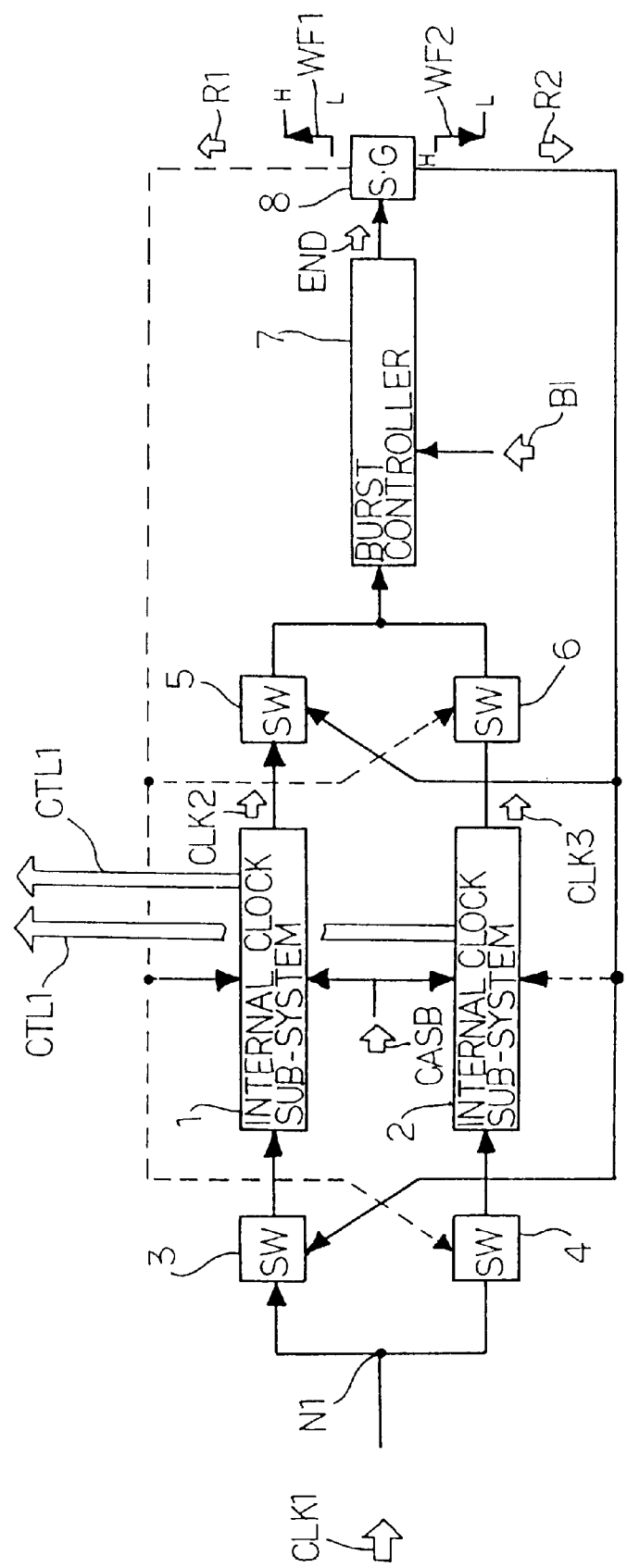
FIG. 1 is a block diagram showing the dual internal clock system and the burst controller incorporated in the prior art synchronous dynamic random access memory device disclosed in Japanese Patent Publication of Unexamined Application No. 7-98981.
Figure 2:
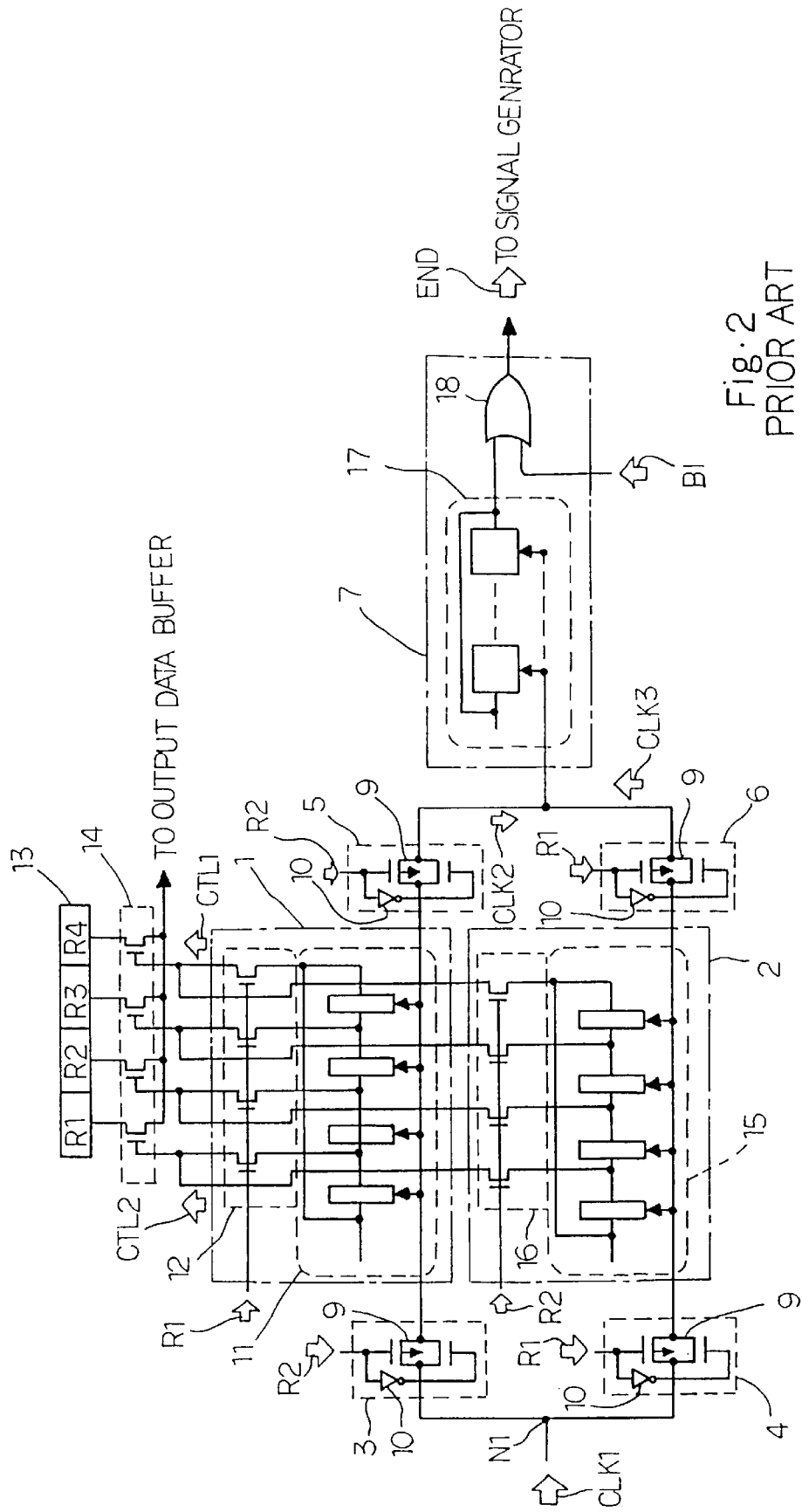
FIG. 2 is a circuit diagram showing the circuit configuration of the dual internal clock system and the burst controller.
Figure 3:
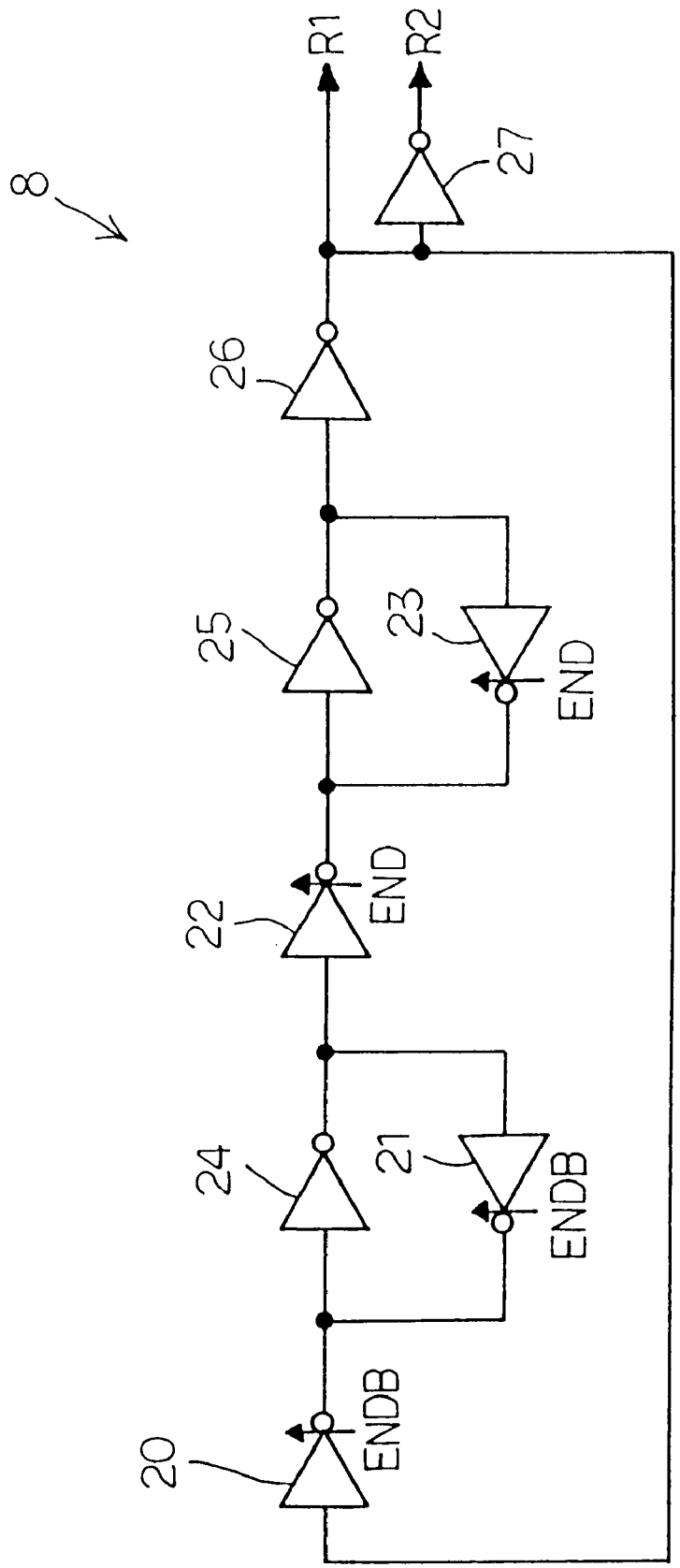
FIG. 3 is a logic diagram showing the arrangement of the signal generator incorporated in the prior art synchronous dynamic random access memory device.
Figure 4:
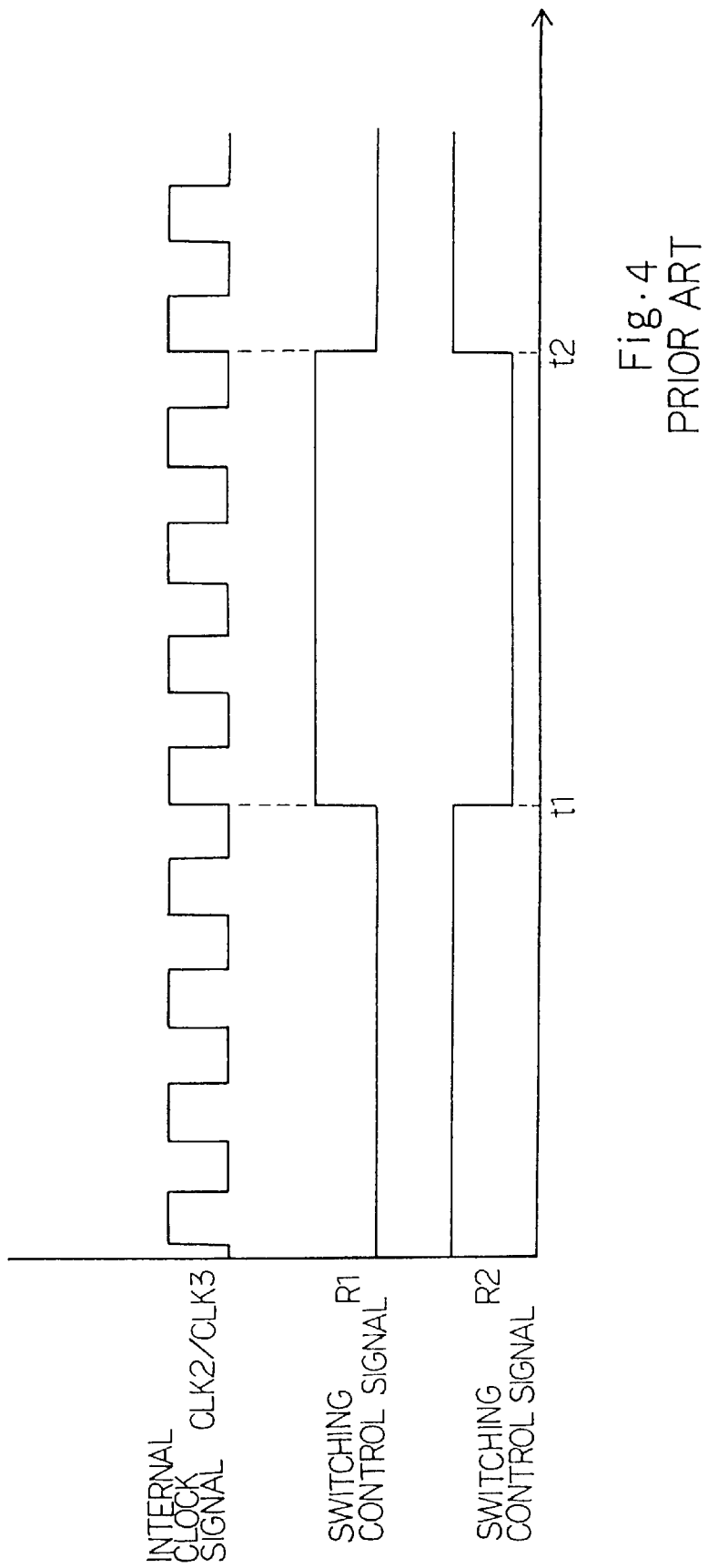
FIG. 4 is a timing chart showing the circuit behavior of the signal generator.
Figure 5:
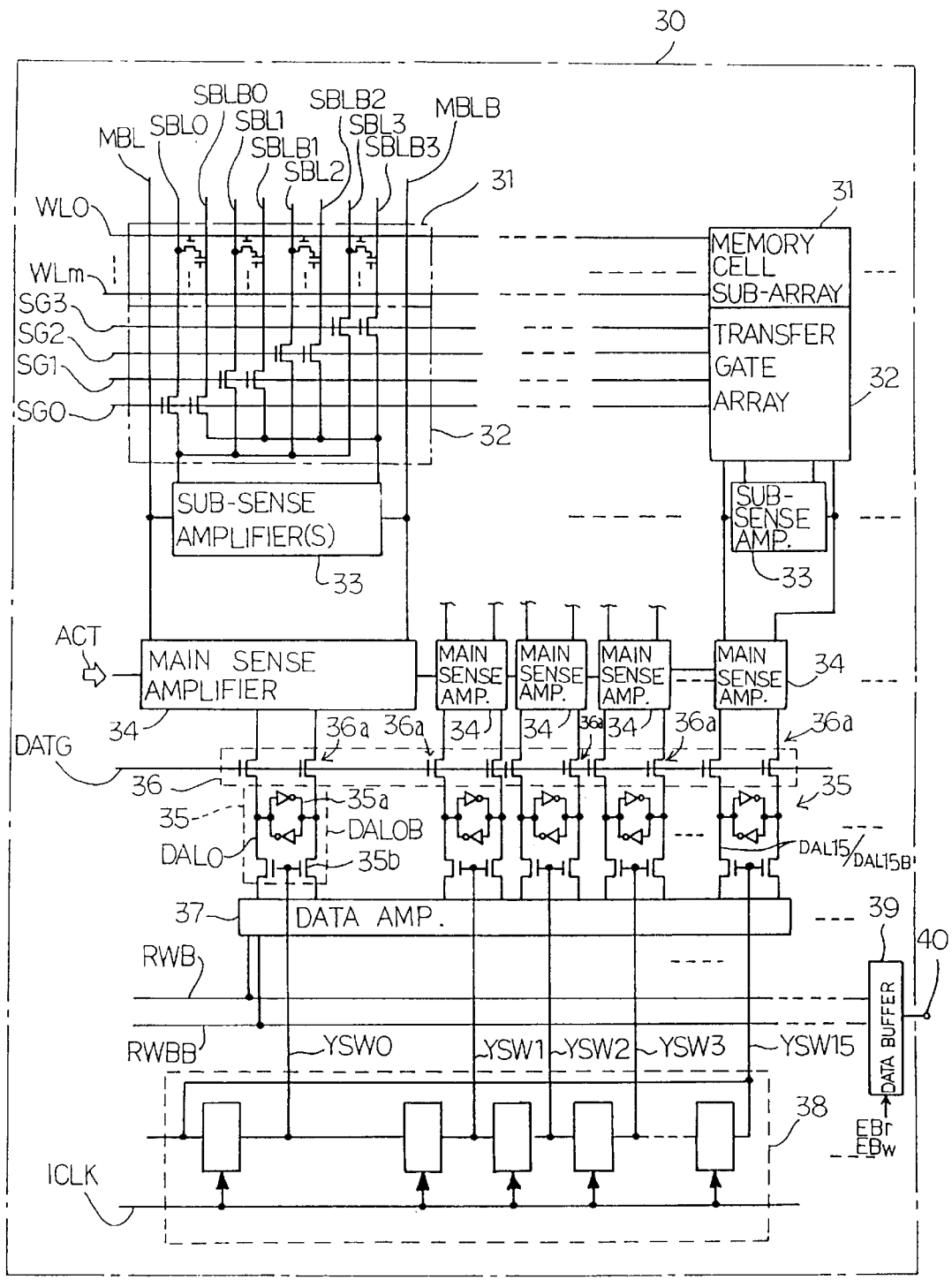
FIG. 5 is a block diagram showing the arrangement of a semiconductor dynamic random access memory device according to the present invention.

Referring to FIG. 5 of the drawings, a dynamic random access memory device embodying the present invention is fabricated on a semiconductor chip 30. The dynamic random access memory device comprises memory cell sub-arrays 31 for storing data bits. In this instance, sixteen memory cell sub-arrays 31 form a memory cell array, and description is made on the memory cell array.

The dynamic random access memory device further comprises transfer gate arrays 32 respectively associated with the memory cell sub-arrays 31, sub-sense amplifiers 33 also associated with the memory cell sub-arrays 31 and main sense amplifiers 34 respectively associated with the memory cell sub-arrays 31. Thus, each memory cell sub-array 31 is accompanied with one of the transfer gate arrays 32, one of or a group of sub-sense amplifiers 33 and one of the main sense amplifiers 34, and description is focused on the left-most memory cell sub-array 31 and the associated circuits 32 to 34, because the others are similar to them.

Plural memory cells are arranged in rows and columns, and form the memory cell sub-array 32. The memory cells are of the one-transistor-one-capacitor type, and store data bits in the form of electric charge. The transistor and the capacitor are hereinbelow referred to as "access transistor" and "storage capacitor", respectively.

A main bit line pair MBL/MBLB and four sub-bit line pairs SBL0/SBLB0, SBL1/SBLB1, SBL2/SBLB2 and SBL3/SBLB3 are associated with the memory cell sub-array 31. In this instance, the memory cells are arranged in four columns, and the four sub-bit line pairs SBL0/SBLB0 to SBL3/SBLB3 are connected to the drain nodes of the access transistors of the four columns. The main bit line pair MBL/MBLB is not directly connected to the access transistors.

A set of word lines WL0 to WLm is shared between the sixteen memory cell sub-arrays 31. The word lines WL0 to WLm are respectively associated with the rows of memory cells of each of the sixteen memory cell sub-arrays 31, and are connected to the gate electrodes of the access transistors of the associated rows. Though not shown in FIG. 5, a word line driver is connected to the word lines WL0 to WLm, and selectively changes the word lines WL0 to WLm to active high level. The selected word line causes the access transistors of the associated row to turn on, and make the memory cells accessible. The word line driver is hereinlater described in connection with an internal timing generator. The four sub-bit line pairs SBL0/SBLB0 to SBL3/SBLB3 are electrically connected through the access transistors to the storage capacitors, and the electric charge stored in the storage capacitors produce small potential differences representative of data bits on the sub-bit line pairs SBL0/SBLB0 to SBL3/SBLB3, respectively.

The transfer gate array 32 has four pairs of transfer transistors, and the four pairs of transfer transistors are connected between the four sub-bit line pairs SBL0/SBLB0 to SBL3/SBL3 and a pair of data nodes of the sub-sense amplifier 33. The sub-sense amplifier 33 has another pair of data nodes, which is connected to the main bit line pair MBL/MBLB. The main bit line pair MBL/MBLB is further connected to the main sense amplifier 34. The subsense amplifier 33 and the main sense amplifier 34 to amplify the small potential difference representative of a data bit.

Four gate control lines SG0, SG1, SG2 and SG3 are respectively associated with the four pairs of transfer transistors, and are sequentially changed to active high level in a time division during a single access cycle. The transfer gate array 32 sequentially connects the sub-sense amplifier 33 to the four sub-bit line pairs SBL0/SBLB0 to SBL3/SBLB3, and four data bits are transferred between the sub-sense amplifier 33 and the four sub-bit line pairs SBL0/SBLB0 to SBL3/SBLB3 during each access cycle. Thus, the four data bits are serially transferred between the memory cell sub-array 32 and the sub-sense amplifier 33.

The dynamic random access memory device further comprises plural data latch circuits 35 respectively associated with the main sense amplifiers 34 for each memory cell array, a transfer gate array 36 connected between the main sense amplifiers 34 and the data latch circuits 35, a data amplifier 37 connected to the data latch circuits 35, a shift register 38 connected through column selecting lines YSW0, YSW1, YSW2, YSW3, ... and Y15 to the data latch circuits 35, a data buffer 39 connected through a read/write data bus RWB/RWBB to the data amplifier 37 and a data port 40 connected to the data buffer 39. As described hereinbefore, sixteen memory cell sub-arrays 31 form a memory cell array, and sixteen main sense amplifiers 34 are incorporated in the memory cell array 34. Therefore, sixteen data latch circuits 35 are respectively connected through the transfer gate array 36 to the sixteen main sense amplifiers 34, and the data amplifier 37 is shared between the sixteen data latch circuits 35. The read/write data bus RWB/RWBB serially propagates data bits between the data amplifier 37 and the data buffer 39, and the data buffer 39 is controlled with internal enable signals EBr/EBw. The dynamic random access memory device communicates with an external device (not shown) through the data port 40. The column selecting lines YSW0 to YSW15 are respectively associated with the sixteen data latch circuits 35, and data bits are sequentially transferred between the data amplifier 37 and the data latch circuits 35 under the control of the shift register 38.

The data latch circuit 35 includes a data memory circuit 35a, a pair of switching transistors 35b and a pair of data lines DAL0/DAL0B, . . . or DAL15/DAL15B connected between the pair of switching transistors 35b and the transfer gate array 36, and the data memory circuit 35a is connected to the pair of data lines DAL0/DAL0B, . . . or DAL15/DAL15B. The pair of switching transistors 35b is gated by the associated column selecting line YSW0 . . . or YSW15, and data bits are transferred through the pair of switching transistors 35b between the data amplifier 37 and the data memory circuit 35a. When the column selecting line YSW0 . . . or YSW15 is changed to the active high level, the pair of switching transistors 35b of the associated data latch circuit 35 turns on, and the data amplifier 37 is electrically connected through the pair of switching transistors 35b to the data memory circuit 35a. The shift register 38 is responsive to an internal clock signal on a clock signal line ICLK so as to sequentially change the column selecting lines YSW0 to YSW15 to the active high level, and the data latch circuits 35 and the transfer gate array 32 allows the external device (not shown) to serially access the memory cell array.

The transfer gate array 36 includes plural pairs of switching transistors 36a, and the pairs of switching transistors 36a are connected between the data memory circuits 35a and the main sense amplifiers 34. A gate control line DATG is connected to the gate electrodes of the pairs of switching transistors 36a, and causes the pairs of switching transistors 36a to concurrently turn on. Then, data bits are transferred between the data memory circuits 35a and the main sense amplifiers 34.

Figure 6:
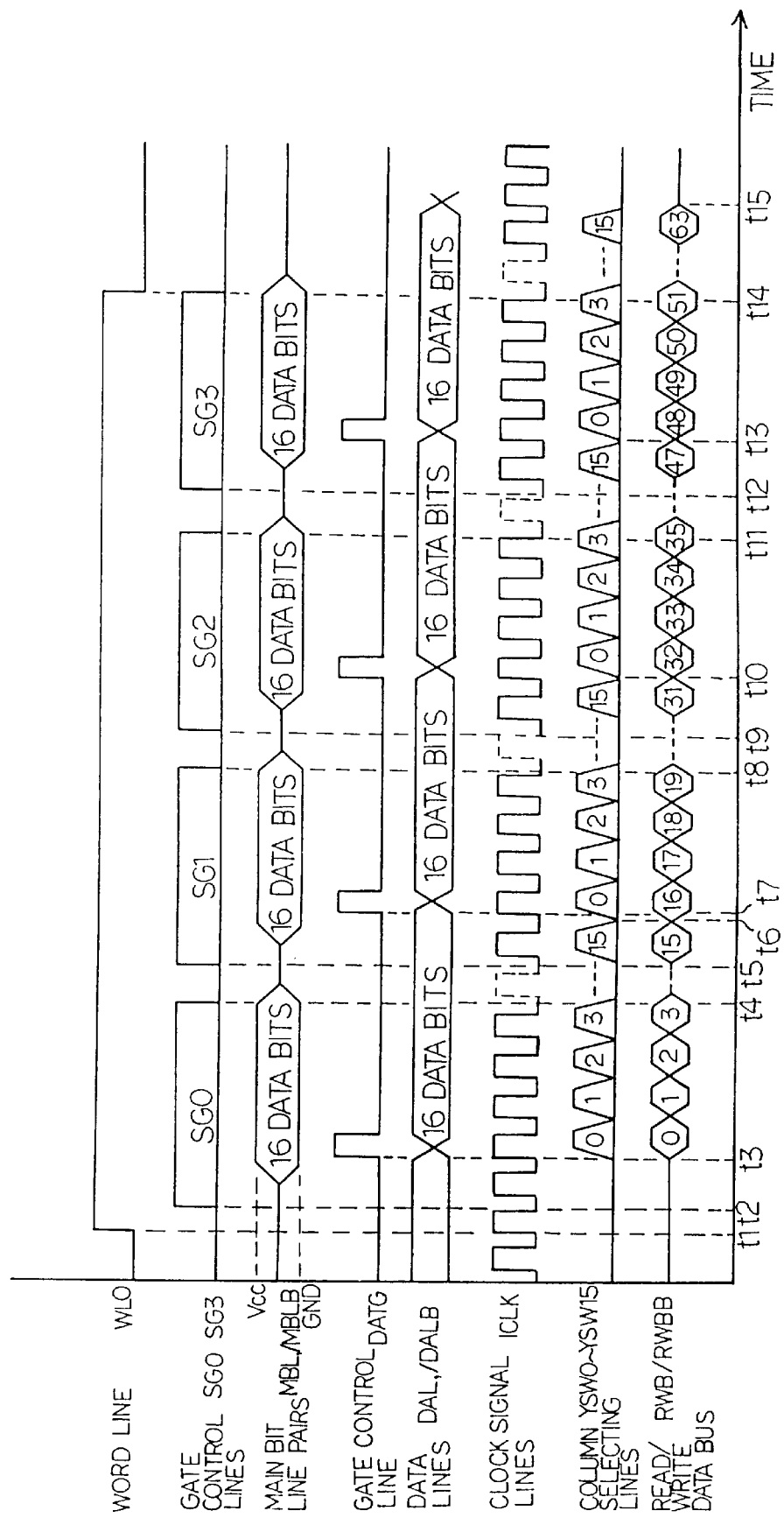
FIG. 6 is a timing chart showing a burst read-out cycle carried out by the semiconductor dynamic random access memory device.

The dynamic random access memory device behaves as follows. FIG. 6 illustrates a burst read-out from the memory cell array, i.e., the sixteen memory cell sub-arrays 31, and sixty-four data bits "0" to "63" are serially read out from the memory cell array.

Assuming now that the word line WL0 is changed to the active high level at time t1, the sixty-four memory cells coupled thereto are electrically connected to the associated sub-bit line pairs SBL0/SBLB0 to SBL3/SBLB3, and produce small potential differences representative of data bits on the associated sub-bit line pairs SBL0/SBLB0 to SBL3/SBLB3.

The gate control line SG0 is changed to the active high level at time t2, and the sixteen data bits are transferred from the sub-bit lines SBL0/SBLB0 though the transfer gate arrays 32 and the sub-sense amplifiers 33 to the main bit line pairs MBL/MBLB. The sixteen data bits are amplified by the main sense amplifiers 33, and the potential difference on each main bit line pair MBL/MBLB is separated between a positive power level Vcc and the ground level GND. The data bits are refreshed, and restored through the sub-bit lines SBL0/SBLB0 in the original sixteen memory cells.

The gate control line DATG is changed to the active high level at time t3, and the sixteen data bits are transferred from the main sense amplifiers 34 to the data latch circuits 35. The sixteen data bits are stored in the data memory circuits 35a in the form of potential difference.

The shift register 38 sequentially changes the column selecting lines YSW0 to YSW15 to the active high level in response to the leading edge of the internal clock signal, and the sixteen data bits "0" to "15" are sequentially transferred from the data latch circuits 35 to the data amplifier 37 between time t3 to time t6. The data amplifier 37 successively amplifies the data bits "0" to "15", and the data bits are transferred through the read/write data bus RWB/RWBB to the data buffer 39. Thus, the sixteen data bits "0" to "15" are serially read out from the data port 40 from time t3 to time t6. The timing for data transfer from the main sense amplifiers 34 to the data latch circuits 35 are determined such that the shift register 38 selects the column selecting line from YSW0 to YSW15.

The gate control line SG0 is recovered to the inactive low level at time t4, and the gate control line SG1 is changed to the active high level at time t5. The sixteen data bits are transferred from the sub-bit line pairs SBL1/SBLB1 through the transfer gate arrays 32 and the sub-sense amplifiers 33 to the main bit lines MBL/MBLB. The sixteen data bits are amplified by the main sense amplifiers 34, and are restored in the original sixteen memory cells. The sixteen data bits are transferred in parallel to the data latch circuits 35 at time t7, and are serially transferred through the data amplifier 37 and the read/write data bus RWB/RWBB to the data buffer 39 until time t10 as simililar to the data bits "0" to "15". The gate control line DATG is changed to the active high level at time t7 immediately after the transmission of the data bit "15" from the data amplifier 37 to the read/write data bus RWB/RWBB, and the data bit "16" follows the data bit "15". Thus, the sixteen data bits "16" to "31" are serially read out from the data port 40.

The gate control signal line SG1 is recovered to the inactive low level at time t8, and the main bit line pairs MBL/MBLB and the sub-sense amplifiers 33 are reset. The next gate control signal line SG2 is changed to the active high level between time t9 and time t11. Then sixteen data bits "32" to "47" are transferred from the sub-bit line pairs SBL2/SBLB2 to the data latch circuits 35 in parallel, and are serially read out from the data port until time t13.

The gate control signal line SG3 is changed to the active high level between time t12 and time t14, and the data bits "48" to "63" are serially read out from the data port 40 until time t15. The word line WL0 is changed to the inactive low level at time t14, and the sixty-four data bits "0" to "63" are serially read out from the data port 40 during a burst read-out cycle.

Figure 7:
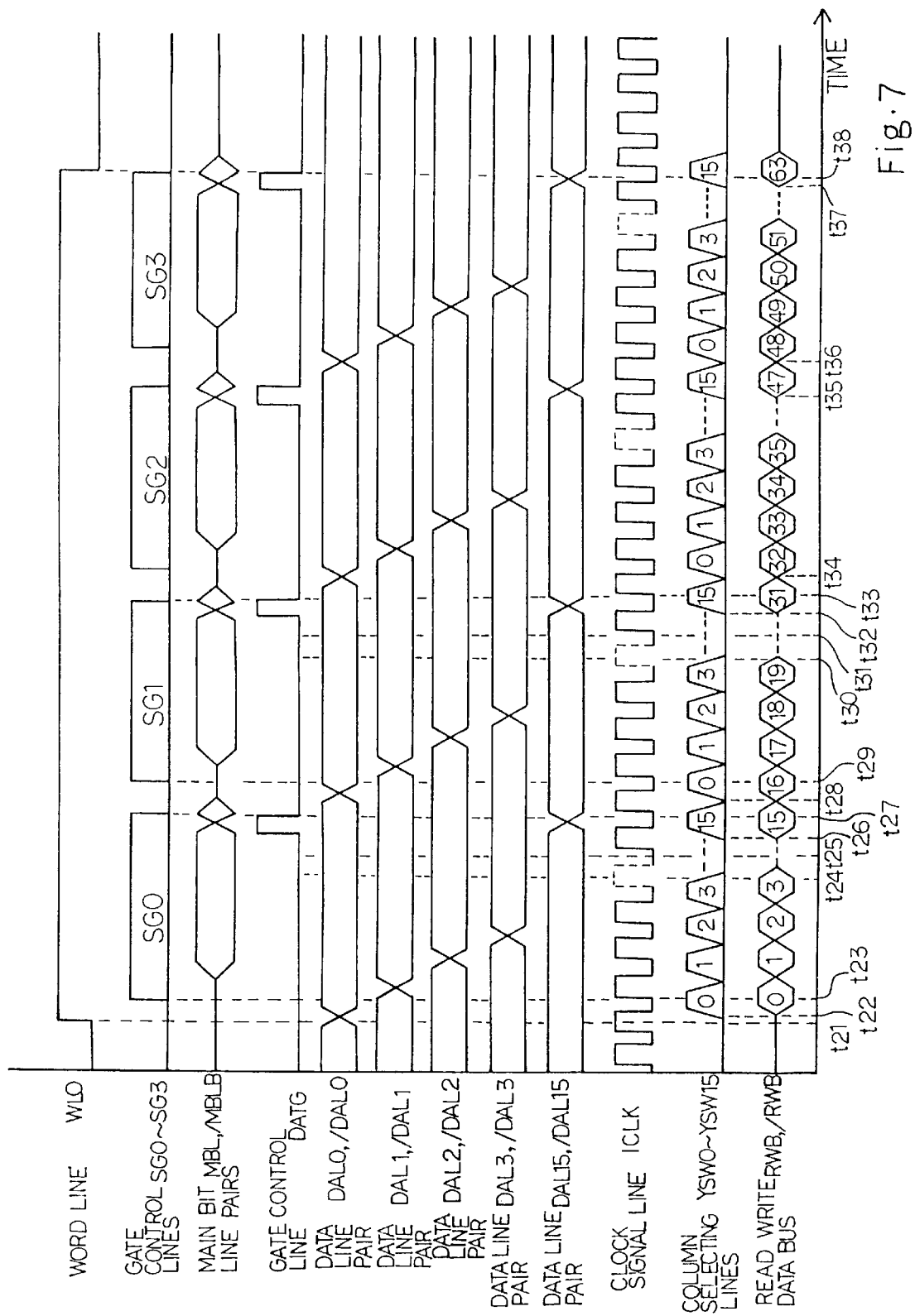
FIG. 7 is a timing chart showing a write-in cycle carried out by the semiconductor dynamic random access memory device.

FIG. 7 illustrates a write-in cycle. In the following description, a serial 16-bit data transfer from the data amplifier 37 to the data latch circuits 35 is referred to as "transfer cycle". The word line WL0 is assumed to be changed to the active high level at time t21. Sixty-four write-in data bits "0" to "63" are serially supplied to the data port 40, and the data buffer 39 successively produces potential differences representative of the write-in data bits oil the read/write data bus RWB/RWBB. The read/write data bus RWB/RWBB successively propagates the write-in data bits to the data amplifier 37, and the data amplifier 37 amplifies the potential differences.

The shift register 38 is responsive to the internal clock signal so as to sequentially change the column selecting lines YSW0 to YWS15 to the active high level from time t22 to time t26, and the write-in data bits "0" to "15" are successively transferred from the data amplifier 37 to the data latch circuits 35. The data buffer 39 supplies the write-in data bits in synchronism with the shift register 38, and the shift register 38 changes the column selecting lines YSW0 to YSW15 to the active high level so as to store the data bits "0" to "15" in the leftmost data latch circuit 35 to the rightmost data latch circuit 35.

The gate control line SG0 is maintained at the active high level from time t23 to time t27, and the sixteen main sense amplifiers 34 are electrically connected through the transfer gate arrays 32 to the sub-bit line pairs SBL0/SBLB0 during the time period from time t23 to time t27. The gate control line DATG is changed to the active high level at time t24, and is maintained at the active high level until time t25. As a result, the sixteen data latch circuits 35 supply the write-in data bits "0" to "m1" stored therein during the present transfer cycle and the write-in data bits "n1" to "63" stored therein during the previous transfer cycle to the main sense amplifiers 33. The write-in data bits are subjected to the sense amplification, and, thereafter, are transferred through the transfer gate arrays 32 to the sub-bit line pairs SBL0/SBL0B. The sixteen write-in data bits pass through the access transistors, and are stored in the storage capacitors.

The write-in data bits "16" to "31" are successively propagated to the data amplifier 37 from time t28 to time t32, and the shift register 38 sequentially changes the column selecting lines YSW0 to YWS15 to the active high level. The write-in data bits "16" to "31" are successively amplified, and, thereafter, stored in the data latch circuits 35, respectively.

The gate control line SG1 is changed to the active high level from time t29 to time t33, and the main bit line pairs MBL/MBLB are electrically connected through the transfer gate arrays 32 to the sub-bit line pairs SBL1/SBL1B. The gate control line DATG is changed to the active high level between time t30 and time t31, and the data latch circuits 35 supply the write-in data bits "16" to "m2" and the write-in data bits "n1" to "15" to the main sense amplifiers 34. The sixteen write-in data bits are subjected to the sense amplification, and are transferred from the main bit line pairs MBL/MBLB to the subbit line pairs SBL1/SBL1B. The sixteen write-in data bits are stored in the memory cells connected to the sub-bit line pairs SBL1/SBL1B.

Similarly, the write-in data bits "32" to "47" are successively transferred to the data amplifier 37 between time t34 to time t35, and the write-in data bits "32" to "m3" and "n2" to "31" are stored in the memory cells connected to the sub-bit lines SBL2/SBLB2. Finally, the write-in data bits "48" to "63" are successively transferred to the data amplifier 37 between time t36 and time t37, and the write-in data bits "48" to "m4" and "n2" to "47" are stored in the memory cells connected to the sub-bit line pairs SBL3/SBL3B. After completion of the write-in cycle, the word line WL0 is recovered to the inactive low level at time t38.

Figure 8:
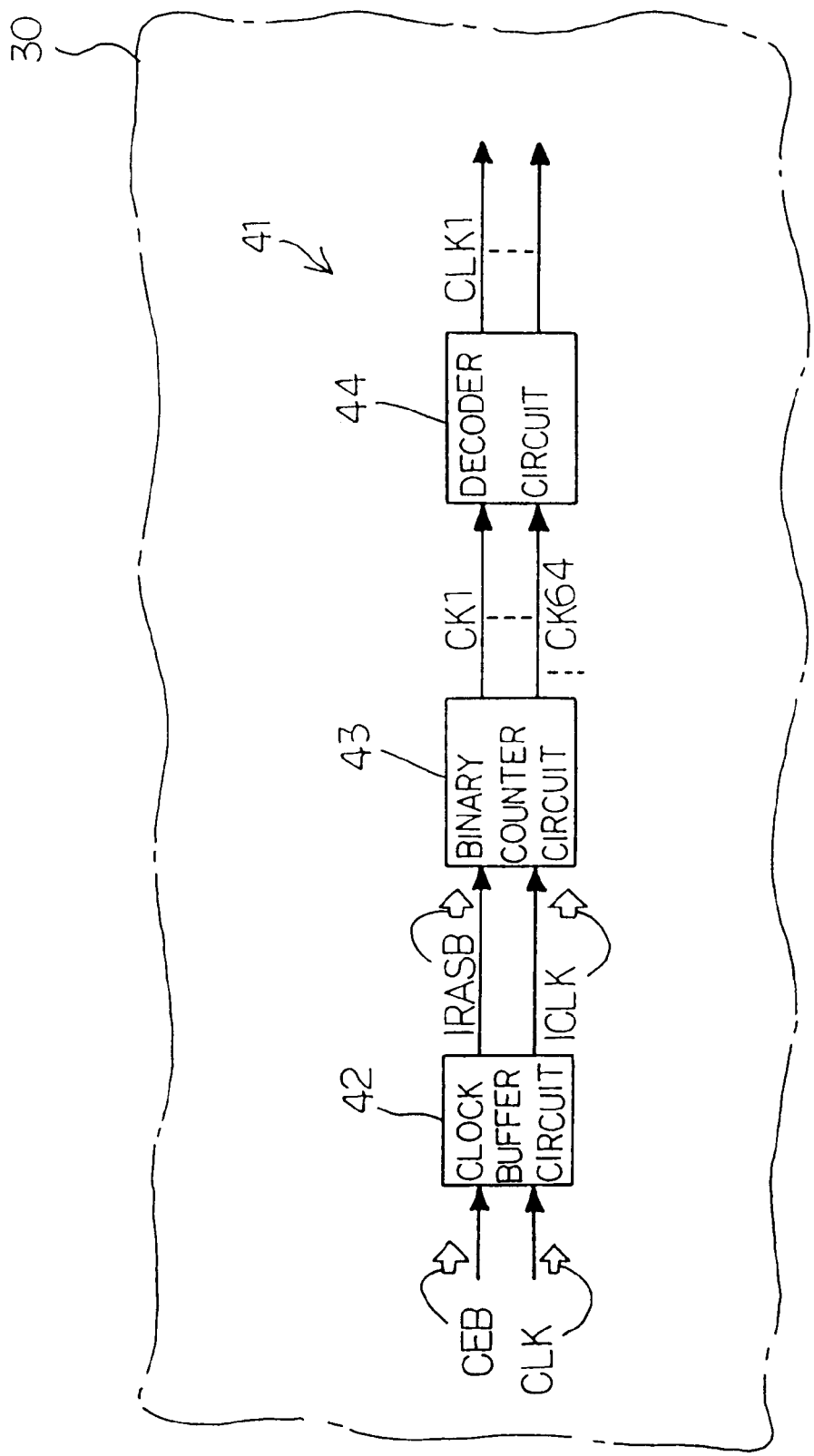
FIG. 8 is a circuit diagram showing the circuit configuration of an internal timing generator incorporated in the semiconductor dynamic random access memory device.

Subsequently, description is made on an internal timing generator. FIG. 8 illustrates an internal timing generator 41. The internal timing generator 41 includes a clock buffer circuit 42, a binary counter circuit 43 and a decoder circuit 44. An external chip enable signal CEB and an external clock signal CLK are supplied to the clock buffer circuit 42, and the clock buffer circuit 42 supplies an internal chip enable signal IRASB and the internal clock signal ICLK to the binary counter circuit 43. The binary counter circuit is reset with the internal chip enable signal IRASB, and starts to count the number of clock pulses supplied thereto as the internal clock signal ICLK. In detail, the external chip enable signal CEB is assumed to go down to the active low level at time t41 (see FIG. 9). The internal chip enable signal IRASB causes the binary counter circuit 43 to start the count operation at time t42, and the output signals CK1, CK2, CK4, CK8, CK16, CK32 and CK64 are changed as shown.

Figure 9:
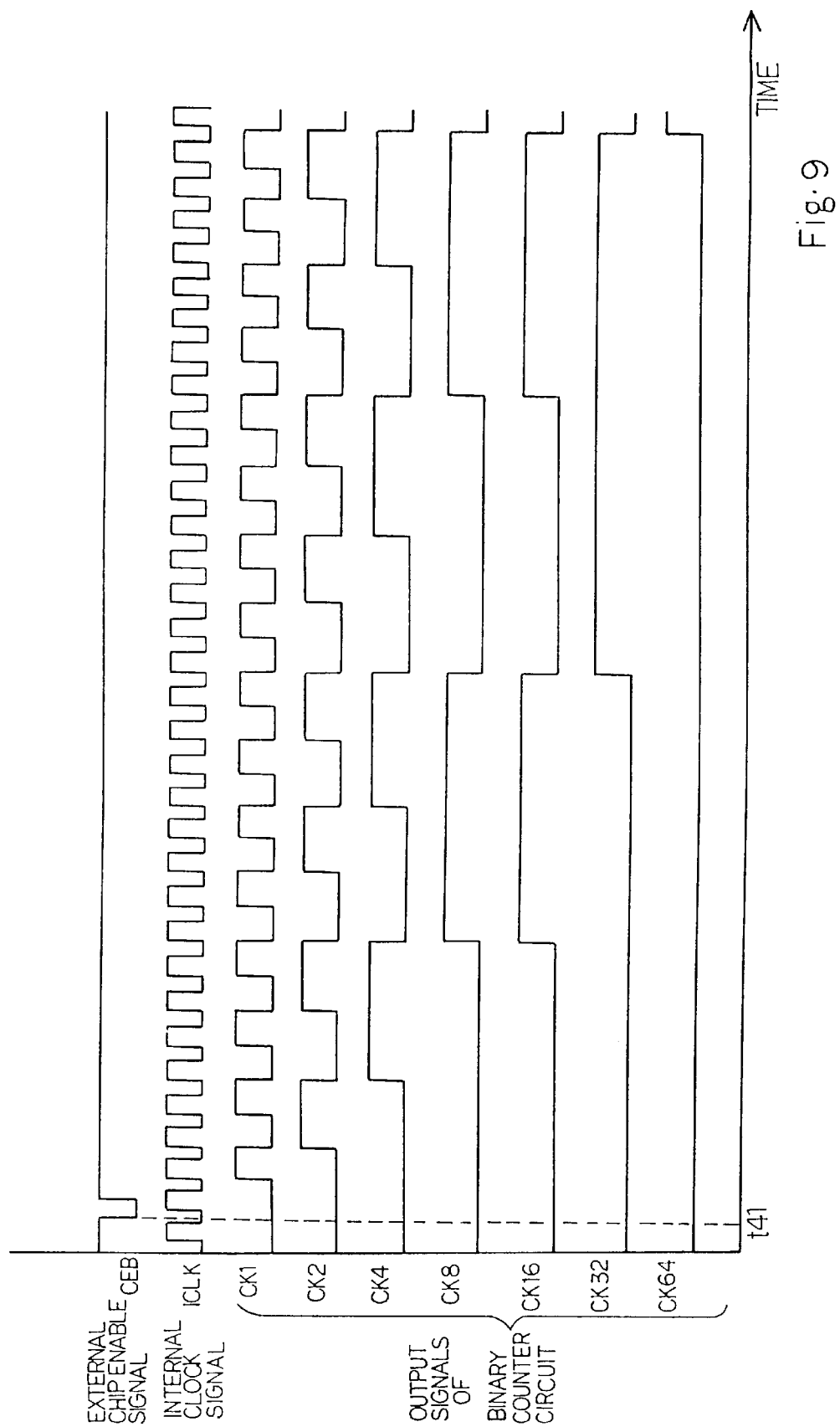
FIG. 9 is a timing chart showing variation of output signals of a binary counter incorporated in an internal timing generator.
Figure 10:
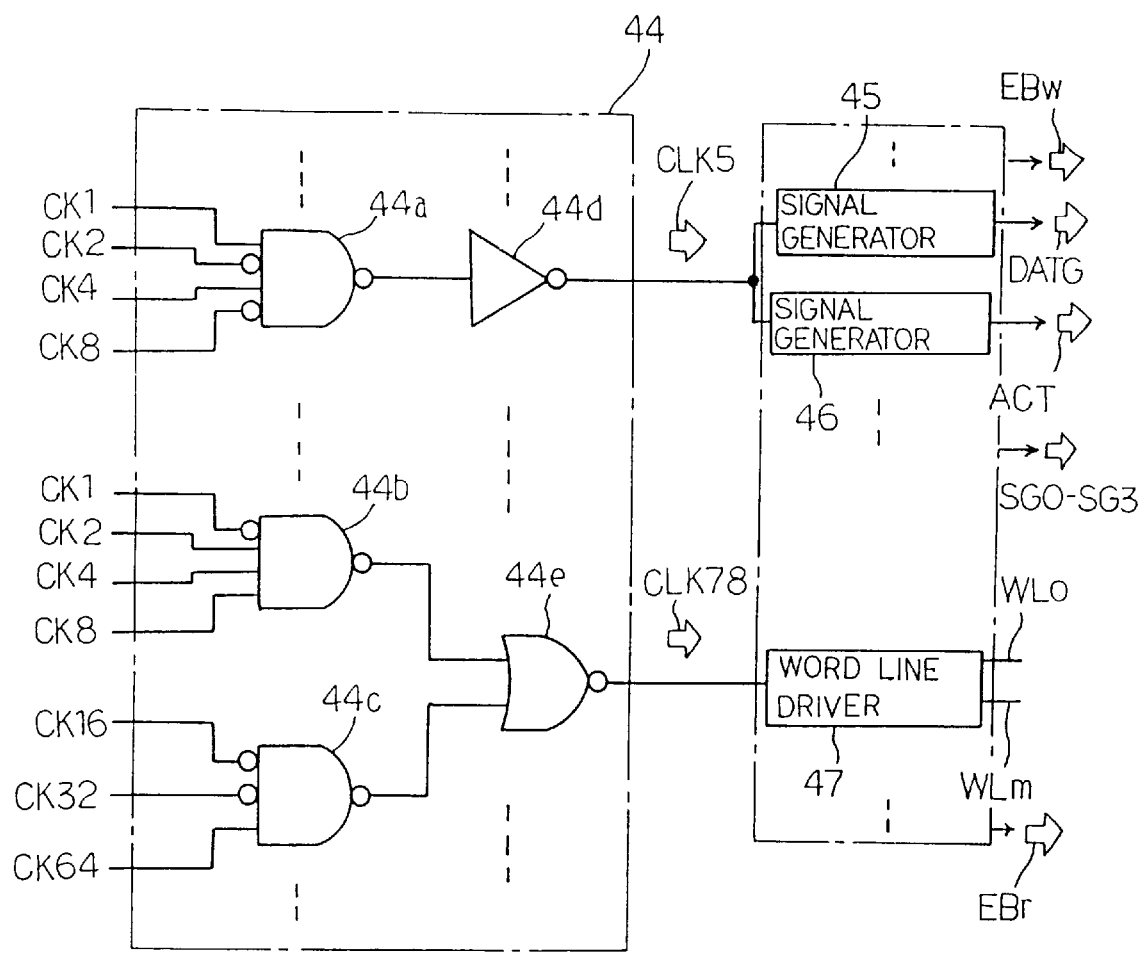
FIG. 10 is a logic diagram showing the configuration of a decoder circuit incorporated in the internal timing generator.

Though not shown in FIG. 9, the binary counter 43 counts eighty internal clock pulses ICLK, and, thereafter, is reset with the internal chip enable signal IRASB, and the burst read-out cycle and the write-in cycle are defined by eighty internal clock pulses ICLK. In detail, the burst read-out cycle is, by way of example, divided into three periods. The first period starts from the change of the chip enable signal to the active low level to the change of the word line to the active high level. The second period is assigned to the four data transfer cycles from the data latch circuits 35 to the data amplifier 37, and the third period is consumed by resetting all the circuits. The first period and the third period require ten internal clock pulses ICLK and six internal clock pulses ICLK. Each data transfer cycle consumes sixteen internal clock pulses ICLK, and sixty-four internal clock pulses ICLK are required for the second period. As a result, the total internal clock pulses for the burst read-out cycle is eighty.

The output signals CK1 to CK64 are supplied to the decoder circuit 44. The decoder circuit 44 decodes the value represented by the output signals CK1 to CK64, and produces decoded signals CLK1, . . . . The decoder circuit 44 includes NAND gates 44a, 44b and 44c, an inverter 44d connected to the NAND gate 44a and a NOR gate 44e connected to the NAND gates 44b/44c. Small bubbles at the input nodes of the NAND gates 44a/44b/44c represent inverters.

The output signals CK1, CK2, CK4 and CK8 are supplied to the NAND gate 44a, and the NAND gate 44a changes the output signal thereof at fifth internal clock pulse and at every sixteenth internal clock pulse thereafter. The inverter 44d produces the decoded signal CLK5 from the output signal of the NAND gate 44a. The decoded signal CLK5 is also changed to the high level at the fifth internal clock pulse, and is changed to the low level at sixth internal clock pulse. Thereafter, the decoded signal CLK5 is changed to the high level at every sixteenth internal clock pulse from the fifth internal clock signal, and is changed to the low level at every seventeenth internal clock signal from the fifth internal clock signal.

Figure 11:
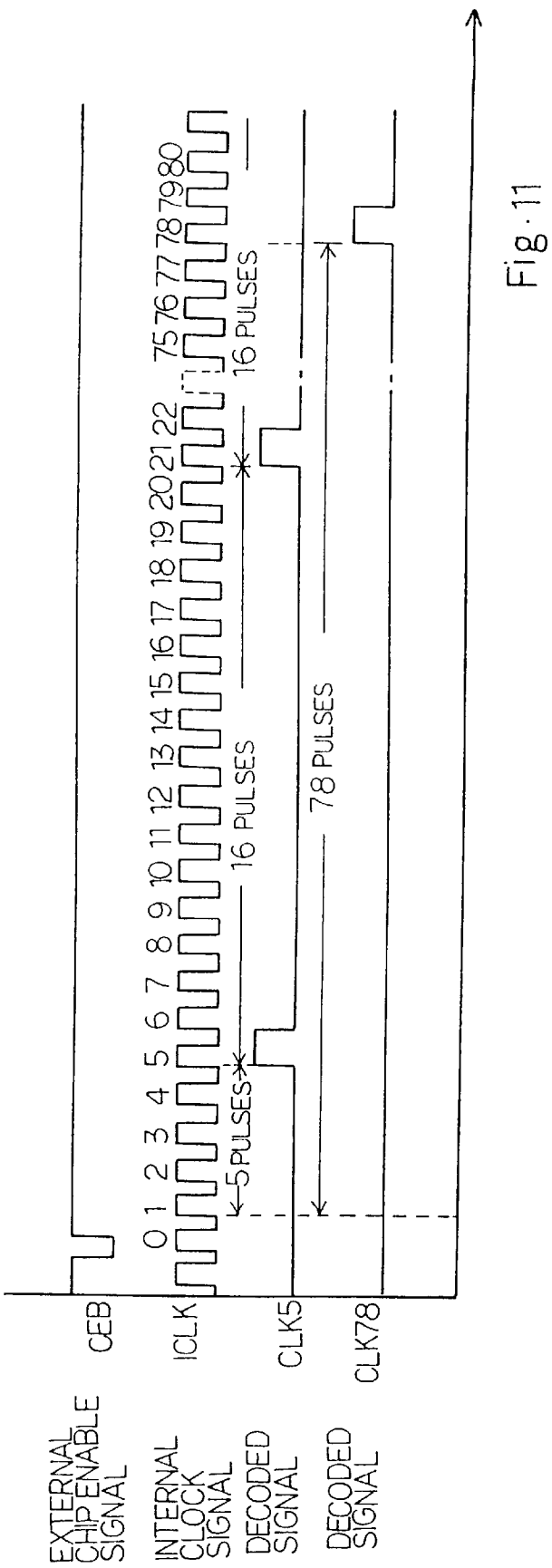
FIG. 11 is a timing chart showing two decoded signals of the decoder circuit.

On the other hand, the output signals CK1, CK2, CK4 and CK8 are supplied to the NAND gate 44b, and the output signals CK16, CK32 and CK64 are supplied to the NAND gate 44c. The output signal of the NAND gate 44b is NORed with the output signal of the NAND gate 44c, and the NOR gate 44e produces the decoded signal CLK78. The decoded signal CLK78 is changed to the high level at the seventy-eighth internal clock pulse as shown in FIG. 11.

The decoded signal CLK5 changed to the active level at every sixteenth internal clock pulse is appropriate for the gate control line DATG and activation of the main sense amplifiers 34. For this reason, the decoded signal CLK5 is supplied to the signal generators 45 and 46. On the other hand, the decoded signal CLK78 changed to the active level at every seventy-eighth internal clock pulse is appropriate for the word line driver 47, because the word line driver 47 once changes selected one of the word lines WL0 to WLm between the active high level and the inactive low level in the burst read-out cycle and the write-in cycle.

In this instance, the sub-bit line pairs SBL0/SBL0B to SBL3/SBLB3 and the main bit line pairs MBL/MBLB as a whole constitute a bit line system, the sub-sense amplifiers 33 and the main sense amplifiers 34 form in combination a sense amplifier system. The data latch circuits 35 serve as temporary data storage circuits, and the shift register 38 realizes the controller. The data amplifier 37, the read/write data bus RWB/RWBB and the data buffer 39 as a whole constitute an interface.

Figure 12:
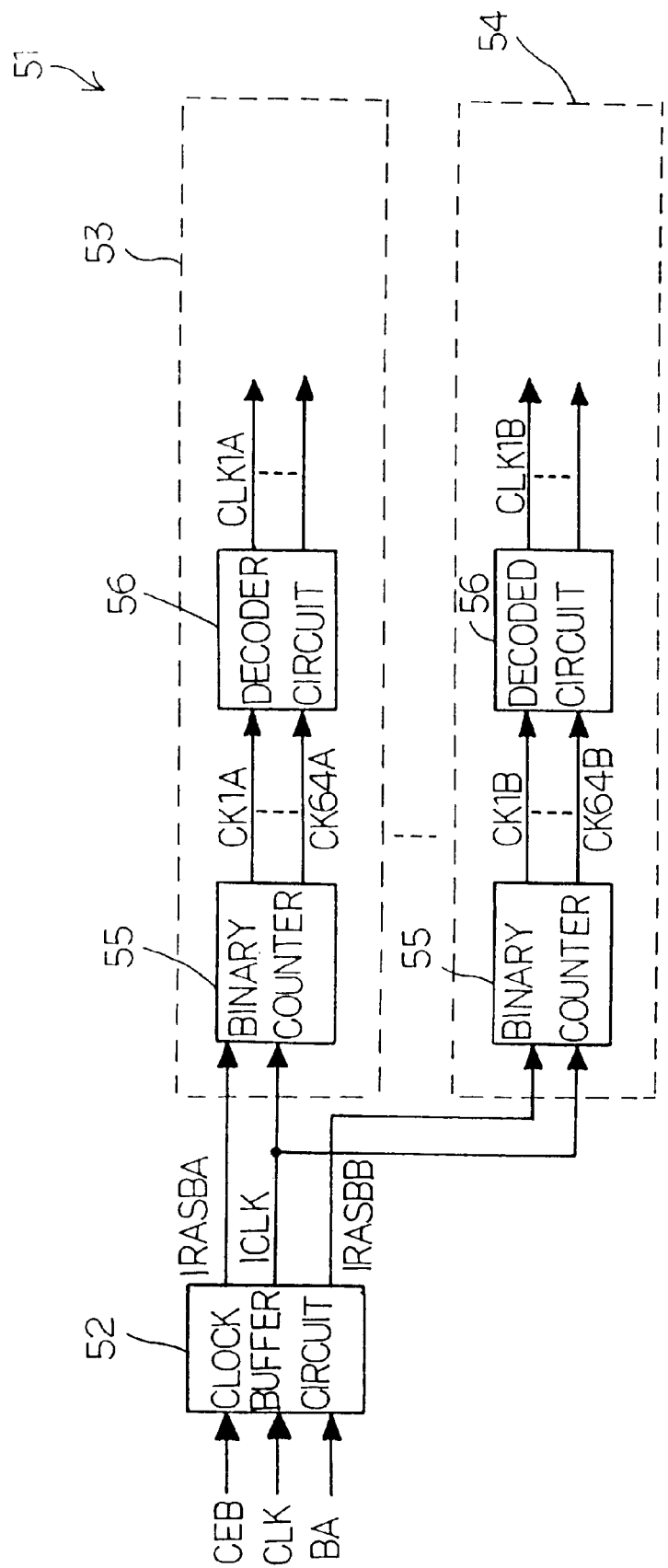
FIG. 12 is a block diagram showing a modification of the internal timing generator incorporated in a multiple bank dynamic random access memory device.

When plural banks BANK-A/BANK-B are incorporated in the dynamic random access memory device, the internal timing generator is modified as shown in FIG. 12. The internal timing generator 51 comprises a clock buffer circuit 52 and plural internal timing sub-generators 53 and 54. Each of the plural internal timing sub-generators 53/54 includes a binary counter 55 and a decoder circuit 56. A bank address signal BA is supplied to the clock buffer circuit 5 together with the external chip enable signal CEB and the external clock signal CLK, and the clock buffer circuit 52 produces the internal clock signal ICLK and plural internal chip enable signals IRASBA and IRASBB. The plural internal chip enable signals IRASBA and IRASBB are respectively supplied to the plural internal timing sub-generators 53/54, and are selectively changed to the active level. Thus, the internal timing sub-generators 53/54 are selectively activated with the associated internal chip enable signals IRASBA/IRASBB.

The internal chip enable signal IRASBA/IRASBB enables the binary counter 55, and the binary counter 55 starts to count the internal clock pulses ICLK. The binary counter 55 sequentially changes the output signals CK1A to CK64A or CK1B to CK64B, and the decoder 56 decodes the output signals CK1A–CK64A/CK1B–CK64B. The decoded signals CLK1A, . . . or CLK1B . . . are supplied to the signal drivers associated with the bank BANK-A or BANK-B as similar to the decoder circuit 44.

Figure 13:
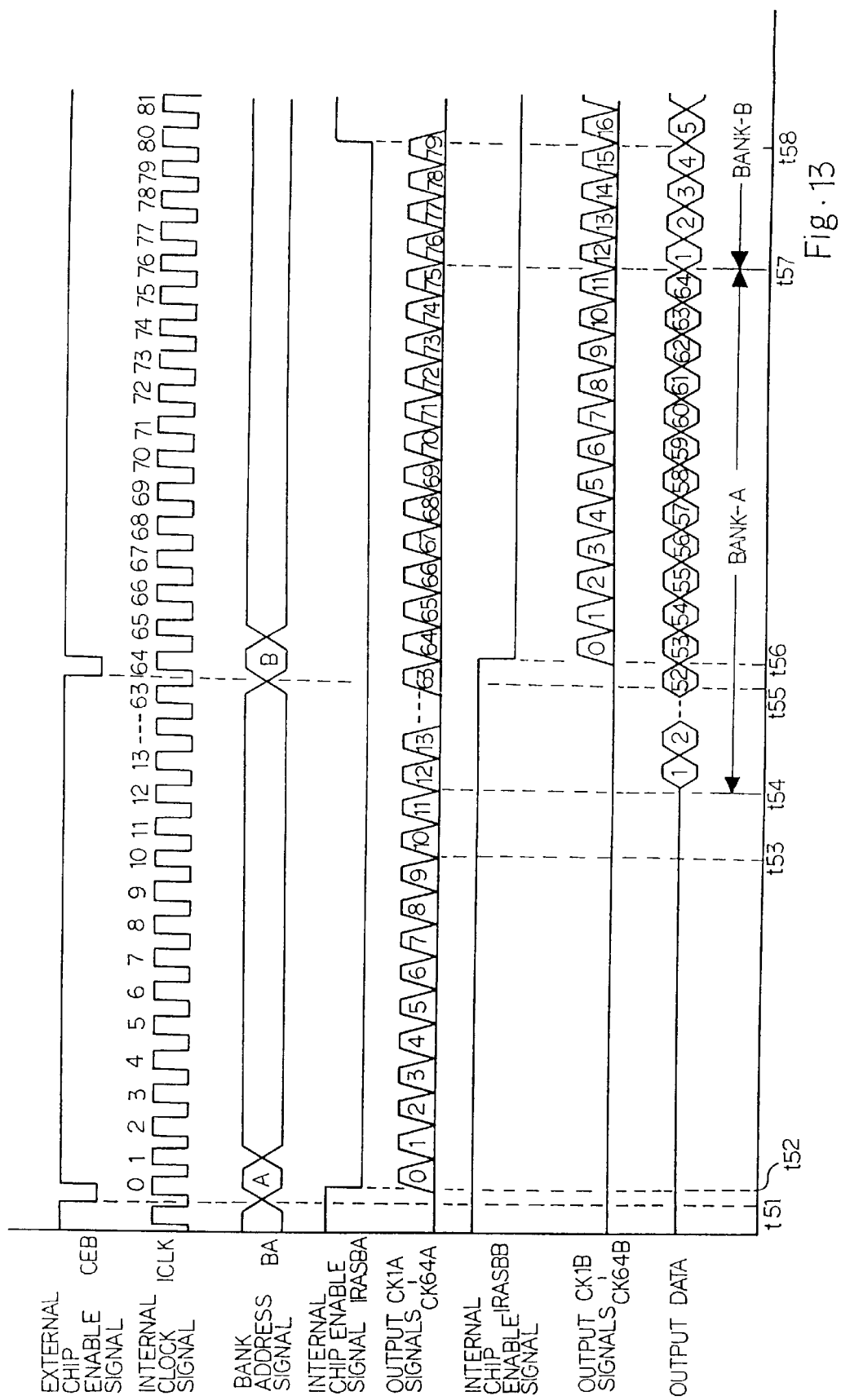
FIG. 13 is a timing chart showing a burst access to the memory banks incorporated in the multiple bank dynamic random access memory device shown in FIG. 12.

FIG. 13 illustrates a burst access of the multiple bank dynamic random access memory device. The external chip enable signal CEB is changed to the active low level at time t51, and the bank address signal BA specifies one of the banks BNAK-A during the internal clock pulse "0". The clock buffer circuit 52 changes the internal chip enable signal IRASBA to the active low level at the leading edge of the next internal clock pulse ICLK, and internal timing sub-generator 53 is enabled with the internal chip enable signal RASBA.

When the binary counter 55 counts ten internal clock pulses, the word line driver changes one of the word lines to the active high level, and data bits stored in the bank BANK-A produce small potential differences on the associated sub-bit line pairs. The count value reaches "12" at time t54, and the data bits are successively read out from the data port between time t54 and time t57.

The external chip enable signal CEB is changed to the active low level, again, at time t55, and the bank address signal BA changes the bank address to "B" in synchronous to the sixty-four internal clock pulses. Then, the clock buffer circuit 52 changes the internal chip enable signal IRASBB to the active low level at time t56. Then, the internal timing sub-generator 54 is enabled with the internal chip enable signal IRASBB, and the binary counter 55 starts to count the internal clock pulse ICLK. The data bits are still read out from the previous bank BANK-A before the value "12", and data bits read out from the bank BNAK-B are successively read out from seventy-six internal clock pulses ICLK.

When the binary counter 55 of the internal timing sub-generator 53 counts seventy-nine internal clock pulses ICLK, the clock buffer circuit 52 recovers the internal chip enable signal IRASBA to the inactive high level, and the peripheral circuits associated with the bank BANK-A are reset at time t58.

In this way, the data bits are serially read out from the plural banks BANK-A and BANK-B. The binary counter 55, the decoder 56 and the signal drivers are provided for each of the memory bank BANK-A/BANK-B, and any undesirable interference does not take place during the long burst access.

As will be understood from the foregoing description, the decoder 44/56 decodes the output signals of the counter 43/55 so as to give appropriate timings to the signal drivers such as 45–47, and the burst access is achieved without any counter exclusively used for the parallel-to-serial conversion. As a result, the dynamic random access memory device is integrated on a relatively small semiconductor chip, and the small semiconductor chip restricts the production cost through improvement of the production yield.

Second Embodiment

Figure 14:
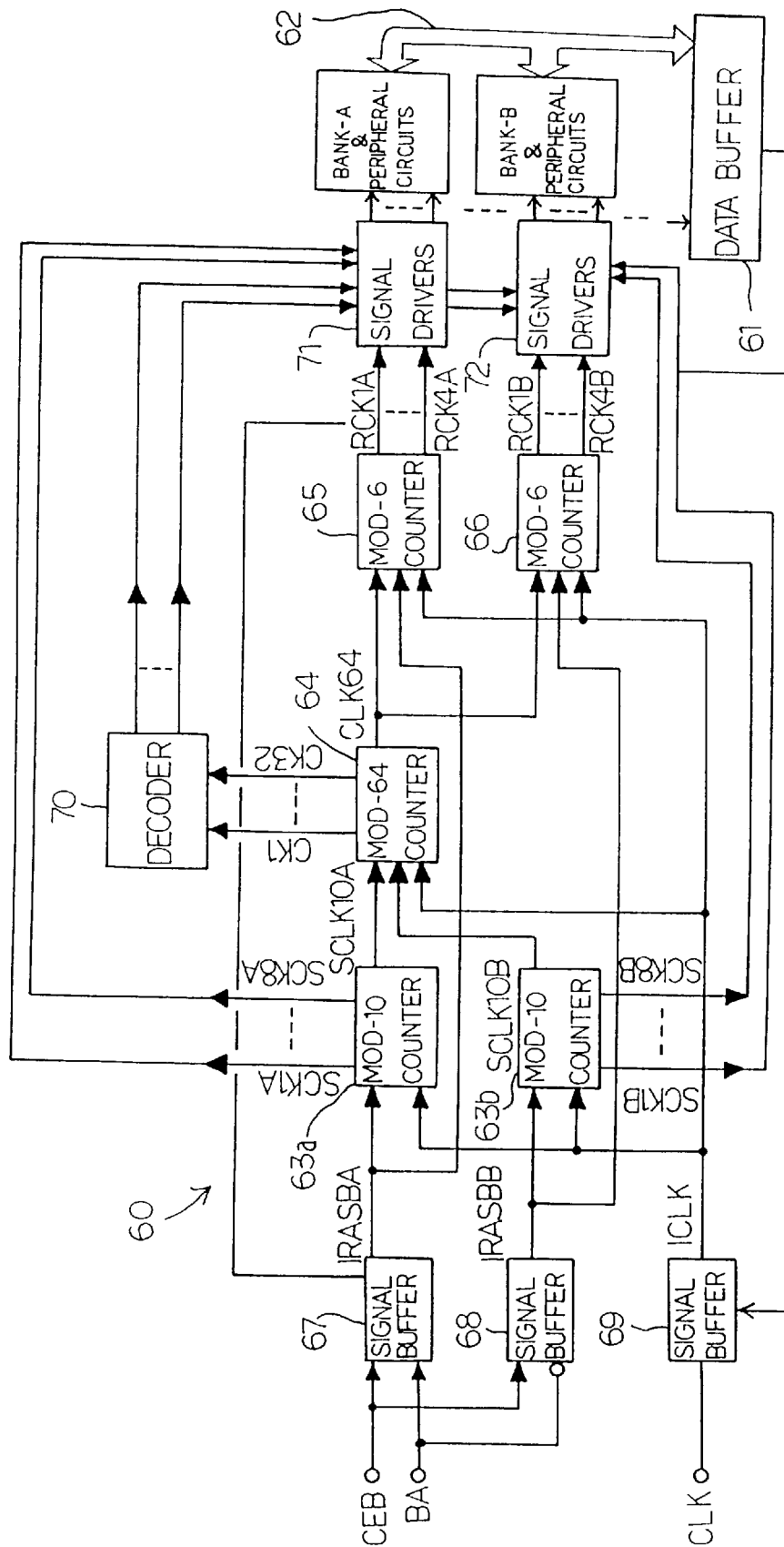
FIG. 14 is a block diagram showing the circuit configuration of an internal timing generator incorporated in another multiple bank dynamic random access memory device according to the present invention.

Turning to FIG. 14 of the drawings, an internal timing generator 60 is provided for two-bank memory, i.e., BANK-A and BANK-B, and each of the banks BANK-A/BANK-B is associated with peripheral circuits such as, for example, a sense amplifier system, transfer gate arrays, data latch circuits and a data amplifier as similar to the memory cell array shown in FIG. 5. A data buffer 61 is connected through a read/write data bus 62 to the data amplifiers, and data bits are serially transferred between the data amplifiers and the data buffer 61. In this instance, sixty-four data bits are serially transferred to the data buffer 61 in a single burst read-out cycle, and the burst read-out cycle is divided into three periods. Ten internal clock pulses ICLK define the first period from the fall of the external chip enable signal CEB to the rise of a selected word line. The sixteen-bit serial data transfer is repeated four times during the second period, and consumes sixty-four internal clock pulses ICLK. The third period is assigned to the reset, and consumes six internal clock pulses ICLK.

In order to count the internal clock pulses, modulo-10 binary counters 63a and 63b work for the first period, and a modulo-64 binary counter 65 counts the sixty-four internal clock pulses ICLK in the second period. Modulo-6 binary counters 65 and 66 are provided for the third period. The two memory banks BANK-A and BANK-B require the respective modulo-10 binary counters 63a/63b and the respective modulo-6 binary counters 65/66. However, the modulo-64 binary counter 64 is shared between the memory banks BANK-A and BANK-B, because both memory banks BANK-A/BANK-B are never concurrently accessed. The modulo-64 binary counter occupies an area much wider than the area occupied by the modulo-10 binary counter 63a/63b or the area occupied by the modulo-6 binary counter 65/66. However, only one modulo-64 binary counter is shared between the memory banks, and the internal timing generator 60 does not seriously enlarge the semiconductor chip.

The modulo-10 binary counters 63a/63b produces output signals SCK1A to SCK8A and SCK1B to SCK8B, and supply them to associated signal drivers 71 and 72. The signal drivers 71/72 are responsive to the output signals SCK1A–SCK8A/SCK1B–SCK8B so as to latch address signals and selectively rise a word line. The modulo-6 binary counters 65/66 produce output signals RCK1A–RCK4A and RCK1B–RCK4B, and the output signals RCK1A–RCK4A/RCK1B–RCK4B are supplied to the signal drivers 71/72 so as to reset them.

The internal timing generator 60 further includes signal buffer circuits 67, 68 and 69. The external chip enable signal CEB is supplied in parallel to the signal buffer circuits 67/68, and the bank address signal BA is also supplied in parallel to the signal buffer circuits 67/68. When the external chip enable signal CEB falls to the active low level, the signal buffer circuits 67/68 checks the bank address signal BA to determine whether the bank address signal BA specifies the memory bank BANK-A or the memory bank BANK-B. If the bank address signal BA specifies the bank address assigned to either memory bank BANK-A or BANK-B, the associated signal buffer 67 or 68 changes the internal chip enable signal IRASBA or IRASBB to the active level. The external clock signal CLK is supplied to the signal buffer 69, and the signal buffer 69 produces the internal clock signal ICLK.

The internal timing, generator 60 further includes a decoder 70. The modulo-64 binary counter sequentially changes the output signals CK1 to CK32, and the output signals CK1 to CK32 are decoded by the decoder 70. The decoded signals are selectively supplied to signal drivers 71 and 72, and the signal drivers 71 and 72 provide appropriate timings to the peripheral circuits and the data buffer 61. The signal driver 71 and 72 are reset with the output signals PCK1A to PCK4A and PCK1B to PCK4B as described hereinbefore.

Figure 15:
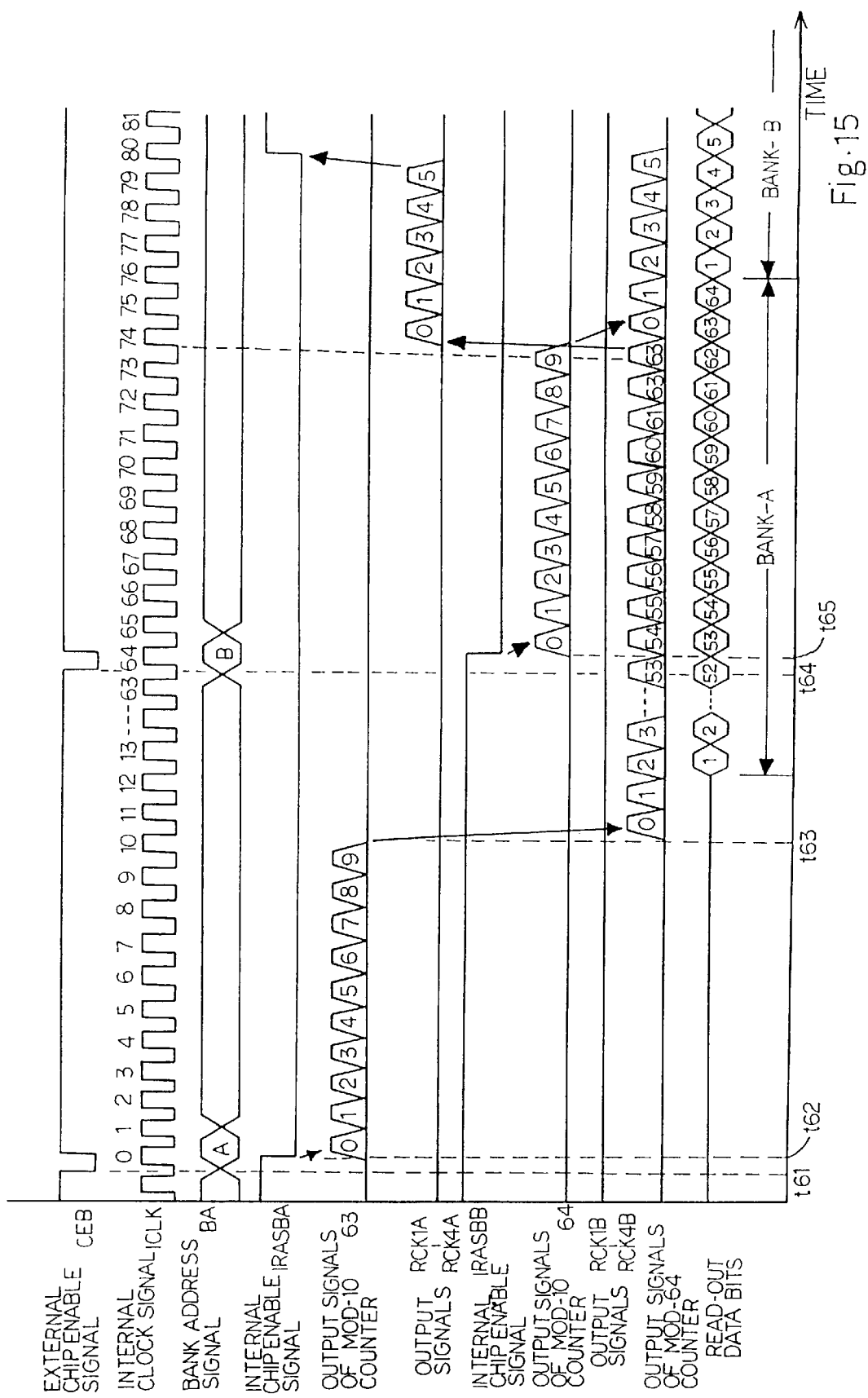
FIG. 15 is a timing chart showing a burst access carried out by the multiple bank dynamic random access memory device shown in FIG. 13.

FIG. 15 illustrates a burst access carried out by the dynamic random access memory device shown in FIG. 13. The external chip enable signal CEB is changed to the active low level at time t61, and the signal buffer 67 latches the bank address signal BA representative of the bank address of the memory bank BANK-A at the leading edge of the internal clock pulse "0". The internal chip enable signal IRASBA is changed to the active low level at time t62. However, the other signal buffer 68 maintains the internal chip enable signal RASBB at the inactive high level. The modulo-10 binary counter 63a starts to count the internal clock pulse ICLK, and increases the value represented by the output signals SCK1A to SCK8A as shown. The signal drivers 71 cause the peripheral circuits associated with the memory bank BANK-A to latch the address signals and rise one of the word lines.

The modulo-10 binary counter 63a reaches value "9" at time t63, and the output signal SCLK10A is changed to the active level. The modulo-64 binary counter 64 starts to count the internal clock pulse ICLK, and the modulo-10 binary counter 63a is reset. The modulo-64 binary counter 63a increments the value in response to the internal clock signal ICLK, and the output signals of the modulo-64 binary counter 64 are decoded so as to give appropriate timings of the burst access to the signal drivers 71.

The modulo-64 binary counter 64 reaches value "63" at the leading edge of the internal clock signal "74", and changes the output signal CLK64 to the active level. Then, the modulo-6 binary counter 65 starts to count the internal clock pulse ICLK. When six internal clock pulses are supplied to the modulo-6 binary counter 65, the modulo-6 binary counter 65 resets the signal buffer 67 and the signal drivers 71. As a result, the selected word line is changed to the inactive low level, and the sense amplifiers are deactivated.

The external chip enable signal CEB is changed to the active low level at time t64, and the signal buffer 68 latches the bank address signal BA. The internal chip enable signal IRASBB is changed to the active low level at time t65, and the above-described sequence is repeated for the memory bank BANK-B. The modulo-10 binary counter 64 reaches the value "9" at the leading edge of the internal clock pulse "74", and the modulo-64 binary counter 64 restarts to count the internal clock pulse ICLK without any interruption.

Thus, the dynamic random access memory device implementing the second embodiment achieves all the advantages of the first embodiment.

Third Embodiment

Figure 16:
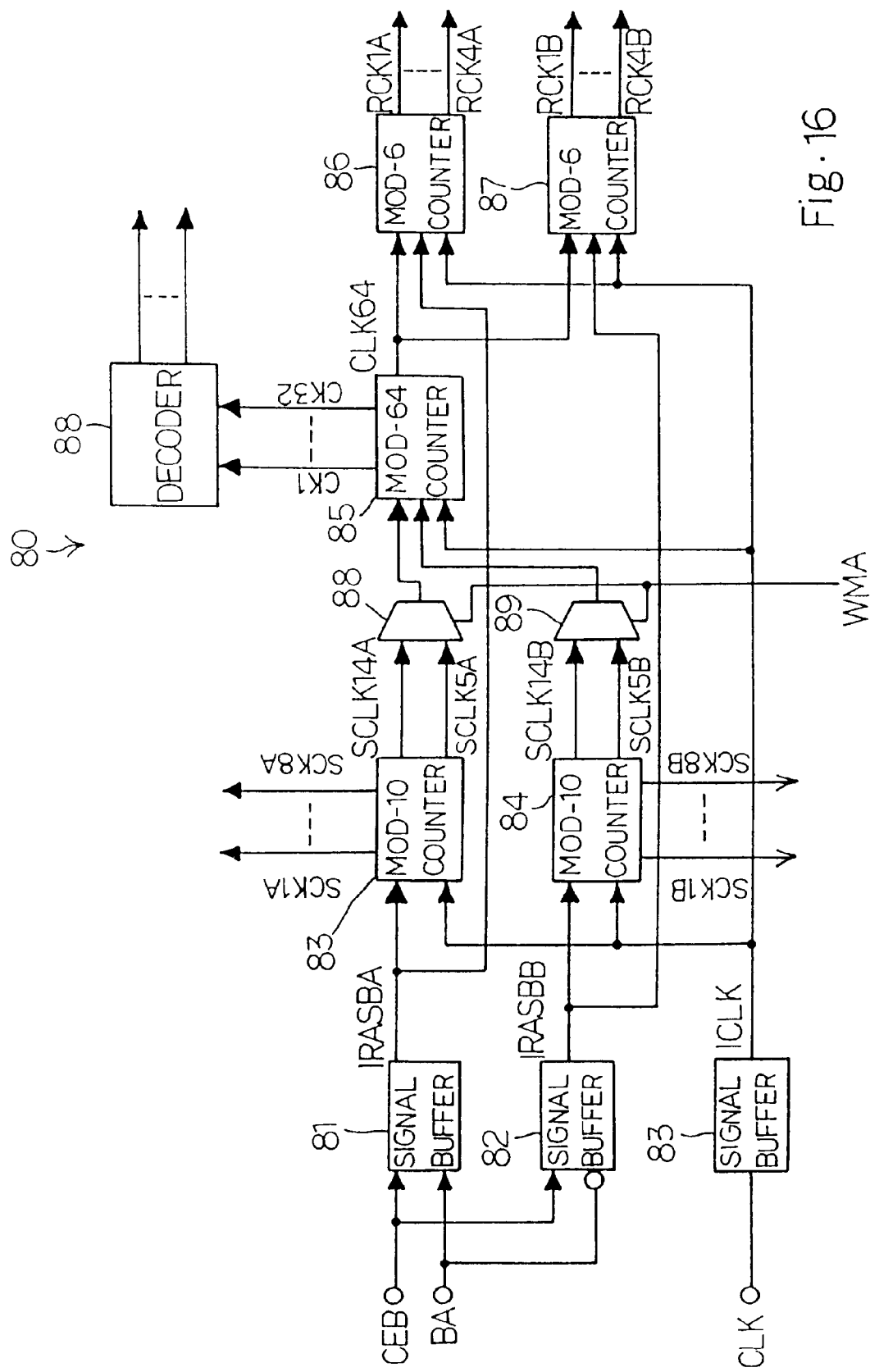
FIG. 16 is a block diagram showing the circuit configuration of an internal timing generator incorporated in yet another multiple bank dynamic random access memory device according to the present invention.

Turning to FIG. 16 of the drawings, an internal timing generator 80 comprises signal buffers 81, 82 and 83, modulo-10 binary counters 83 and 84, a modulo-64 binary counter 85, modulo-6 binary counters 86 and 87 and selectors 88 and 89. The internal timing generator 80 is incorporated in a multiple bank dynamic random access memory device, and each memory bank is similar in configuration to the memory cell array shown in FIG. 5. For this reason, main/sub bit line pairs, transfer gate arrays, main/sub sense amplifiers and other components are hereinbelow labeled with the same references designating corresponding components shown in FIG. 5.

The sub-sense amplifier 33 is shared between the four sub-bit line pairs SBL0/SBLB0 to SBL3/SBLB3, and the transfer gate array 32 successively connects the four bit line pairs SBL0/SBLB0 to SBL3/SBLB3 to the sub-sense amplifier 33. The sixteen memory cell sub-arrays 31 are respectively associated with the sub-sense amplifier 33, and, accordingly, each memory bank is accompanied with the sixteen sub-sense amplifiers 33. In order words, sixteen read-out data bits are concurrently amplified by the sub-sense amplifiers 33, and, thereafter, are transferred in parallel to the sixteen main sense amplifiers 34, respectively. The sixteen read-out data bits are transferred in parallel from the main sense amplifiers 34 to the sixteen data latch circuits 35, and are sequentially transferred to the single data amplifier 37 by controlling the column selecting lines YSW0 to YSW15. The parallel-to-serial data transfer is carried out for each of the sub-bit line pairs SBL0/SBLB0 to SBL3/SBLB3, and is repeated four times. As a result, sixty-four read-out data bits are serially transferred through the read/write data bus RWB/RWBB to the data buffer 39.

On the other hand, when a sixty-four burst data write-in is requested, sixteen write-in data bits are serially transferred through the read/write data bus RWB/RWBB to the data amplifier 37, and are successively stored in the sixteen data latch circuits 35. When the sixteen data bits are respectively stored in the data latch circuits 35, the transfer gate signal DATG is changed to the active level, and the sixteen write-in data bits are transferred in parallel from the data latch circuits 35 to the main sense amplifiers 34. For this reason, it is necessary to retard the change of the transfer gate signal DATG until the sixteen write-in data bits are stored in the data latch circuits 35. However, if the transfer gate signal DATG is changed in the burst read-out cycle at the same timing as the burst write-in cycle, the data access is unduly delayed. On the other hand, if the change of the transfer gate signal DATG is advanced in the burst read-out cycle, the other control signals such as sense amplifier activation signals SAP/SAN are also advanced, and the internal timing generator is enlarged.

The selectors 88/89 are incorporated in the internal timing generator 80, and are responsive to a write-in mode signal WMA so as to selectively transfer the output signals of the modulo-10 counters 83/84 to the modulo-64 binary counter 85. For this reason, two modulo-10 binary counters 83/84 make the activation timing of the transfer gate signal DATG different between the burst write-in cycle and the burst read-out cycle without dualization of the modulo-64 binary counter 85.

Figure 17:
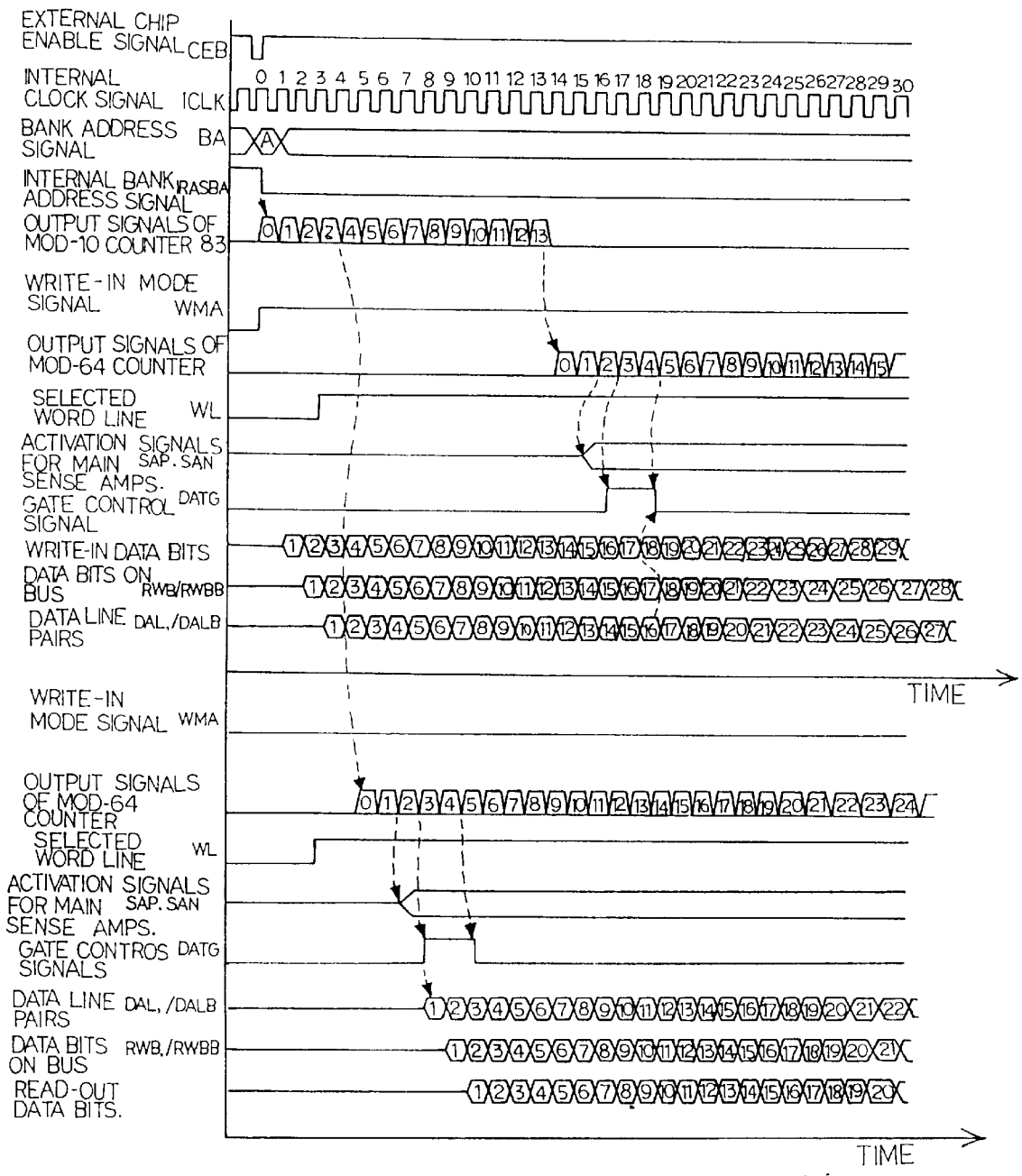
FIG. 17 is a timing chart showing a burst access carried out by the multiple bank dynamic random access memory device shown in FIG. 15.

FIG. 17 illustrates the burst write-in cycle and the burst read-out cycle. When the burst write-in cycle is requested, the write-in mode signal WMA is changed to the high level, and the selector 88 is changed so as to transfer the output signal SLK14A to the modulo-64 counter 85. For this reason, the modulo-64 binary counter 85 starts to count the internal clock pulse ICLK at the internal clock pulse "14". A single internal clock pulse ICLK is consumed for the data transfer to the read/write data bus RWB/RWBB, and the data transfer from the read/write data bus RWB/RWBB to the data line pair also consumes a single internal clock pulse ICLK. For this reason, the data transfer signal DATG is changed to the active high level between the output signal "3" and the output signal "5", and the sixteen write-in data bits are transferred in parallel to the main sense amplifiers 34.

On the other hand, when the burst read-out cycle is requested for the memory bank BANK-A, the write mode signal WMA is in the low level, and the selector 88 becomes transparent to the output signal SCLK5A. For this reason, the modulo-64 binary counter 85 starts to count the internal clock pulses ICLK at the internal clock pulse "5". Even though the modulo-64 binary counter 85 changes the transfer gate signal DATG to the high level between the output "3" and the output "5", the activation timing is advanced rather than that in the burst write-in cycle, and a high-speed data access is achieved.

As will be appreciated from the foregoing description, the internal timing generator controls the burst access without any counter exclusively used for the parallel-to-serial conversion, and the dynamic random access memory device is integrated on a relatively small semiconductor chip.

Although particular embodiments of the present invention have been shown and described, it will be obvious to those skilled in the art that various changes and modifications may be made without departing from the spirit and scope of the present invention.

For example, the memory cell array may be implemented by a static random access memory cell.

The internal timing generator 60 is modified for a multiple bank dynamic random access memory device with more than two memory banks,

What is claimed is:

1. A semiconductor memory device fabricated on a semiconductor chip, comprising:

a plurality of addressable memory cells for storing data bits, an addressing system for selecting accessible memory cells from said plurality of addressable memory cells, a bit line system connected to said plurality of addressable memory cells for supplying first data bits to and from the selected accessible memory cells, a sense amplifier system connected to said bit line system for amplifying said first data bits on said bit line system, a plurality of temporary data storage circuits selectively coupled to said sense amplifier system at intervals for storing second data bits which comprise some portion of said first data bits at each time said addressable memory cells are selected, an interface connectable to said plurality of temporary data storage circuits for serially propagating said first data bits between said plurality of temporary data storage circuits and a data port, a controller for sequentially connecting said plurality of temporary data storage circuits to said interface, and an internal timing generator connected to said controller for providing a starting timing of the serial data propagation of said first data bits, an end point of said serial data propagation as well as activation timings and deactivation timings to said addressing system and said sense amplifier system without any external signal and including a counter for counting clock pulses to generate output signals and a decoder producing timing signals from said output signals for providing said activation timings and said deactivation timings.

2. The semiconductor memory device as set forth in claim 1, in which said controller is responsive to said clock pulses so as to sequentially change column selecting lines to an active level, and said plurality of temporary data storage circuits have respective transfer gates connected to said interface and respectively gated by said column selecting lines.

3. The semiconductor memory device as set forth in claim 1, in which said plurality of addressable memory cells are divided into a plurality of memory cell sub-arrays of a memory bank, said bit line system includes a plurality of sub-bit line pair groups selectively associated with said plurality of memory cell sub-arrays and selectively connected to the addressable memory cells of the associated memory cell sub-arrays, respectively, and a plurality of main bit line pairs respectively associated with said plurality of memory cell sub-arrays, and said sense amplifier system includes a plurality of sub-sense amplifiers respectively associated with said plurality of sub-bit line pair groups and selectively connecting the sub-bit line pairs of the associated sub-bit line pair groups to the associated main bit line pairs for amplifying said first data bits and a plurality of main sense amplifiers respectively connected to said main bit line pairs for amplifying said first data bits thereon.

4. The semiconductor memory device as set forth in claim 3, further comprising a plurality of first transfer gate array respectively connected between said plurality of sub-bit line pair groups and said plurality of sub-sense amplifiers and responsive to a first gate control signal so as to selectively connecting said sub-bit line pairs of the associated sub-bit line pair groups to the associated sub-sense amplifiers.

5. The semiconductor memory device as set forth in claim 4, further comprising a second transfer gate array connected between said plurality of main sense amplifiers and said plurality of temporary data storage circuits and responsive to a second gate control signal so as to concurrently connect said plurality of main sense amplifiers to said plurality of temporary data storage circuits for storing said second data bits therein.

6. The semiconductor memory device as set forth in claim 5, in which said internal timing generator produces a first timing signal for selection of said selected addressable memory cells, a second timing signal for producing said first gate control signal, a third timing signal for producing said second gate control signal and a fourth timing signal for producing an activation signal supplied to said plurality of main sense amplifiers.

7. The semiconductor memory device as set forth in claim 6, in which said internal timing generator supplies said clock pulses to said controller so as to sequentially change column selecting lines to an active level, and said plurality of temporary data storage circuits have respective transfer gates connected to said interface and respectively gated by said column selecting lines.

8. The semiconductor memory device as set forth in claim 3, further comprising another memory bank similar in arrangement to said memory bank, said another memory bank is accompanied with another addressing system similar to said addressing system, another bit line system similar in arrangement to said bit line system, another sense amplifier system similar in arrangement to said sense amplifier system and other temporary data storage circuits similar to said plurality of temporary data storage circuits, and said interface and said internal timing generator are shared therebetween.

9. The semiconductor memory device as set forth in claim 8, in which said internal timing generator further includes a signal buffer supplied with a clock signal, an external control signal and a bank address signal and responsive to said external control signal for producing said clock pulses and a plurality of enable signals selectively changed to an active level depending upon the block address represented by said block address signal, said counter has a plurality of sub-counters respectively associated with said memory bank and said another memory bank and respectively enabled with said plurality of enable signals of said active level for counting said clock pulses, and said decoder has a plurality of sub-decoders respectively connected to said plurality of sub-counters, each of said plurality of sub-decoders providing said starting timing of the serial data propagation of said first data bits, an end point of said serial data propagation as well as activation timings and deactivation timings to the addressing system and the sense amplifier system for the associated memory bank.

10. The semiconductor memory device as set forth in claim 9, in which said plurality of sub-counters are sequentially activated with said plurality of enable signals so that the first data bits of said another memory bank serially follows said first data bits of said memory bank.

11. The semiconductor memory device as set forth in claim 8, in which said counter has respective first counter circuits for defining a first period of a burst access, a second counter circuit shared between said first counter circuits for defining a second period of said burst access after said first period and respective third counter circuits for defining a third period of said burst access after said second period.

12. The semiconductor memory device as set forth in claim 11, in which said addressing system selects the selected addressable memory cells in said first period, said first data bits are serially transferred between said selected addressable memory cells and said interface in said second period, and said addressing system, said sense amplifier system and said interface are reset in said third period.

13. The semiconductor memory device as set forth in claim 11, in which said internal timing generator further includes selectors connected between said first counter circuits and said second counter circuit and responsive to a mode selecting signal representative of one of a burst read-out and a burst write-in so as to change the output signals of said first counter circuits to be transferred to said second counter circuit.

14. The semiconductor memory device as set forth in claim 11, in which said first counter circuits, said second counter circuit and said third counter circuits are implemented by modulo-10 binary counters, a modulo-64 binary counter and modulo-6 binary counters, respectively.

* * * * *